(12) United States Patent
Gibb et al.

(10) Patent No.: US 10,431,580 B1
(45) Date of Patent: Oct. 1, 2019

(54) MONOLITHIC SINGLE CHIP INTEGRATED RADIO FREQUENCY FRONT END MODULE CONFIGURED WITH SINGLE CRYSTAL ACOUSTIC FILTER DEVICES

(71) Applicant: Akoustis, Inc., Huntersville, NC (US)

(72) Inventors: Shawn R. Gibb, Huntersville, NC (US); David Aichele, Huntersville, NC (US); Ramakrishna Vetury, Charlotte, NC (US); Mark D. Boomgarden, Huntersville, NC (US); Jeffrey B. Shealy, Davidson, NC (US)

(73) Assignee: Akoustis, Inc., Huntersville, NC (US)

( * ) Notice: Subject to any disclaimer, the term of this patent is extended or adjusted under 35 U.S.C. 154(b) by 0 days.

(21) Appl. No.: 15/405,167

(22) Filed: Jan. 12, 2017

(51) Int. Cl.
*H01L 27/06* (2006.01)
*H01L 21/02* (2006.01)
(Continued)

(52) U.S. Cl.
CPC ...... *H01L 27/0605* (2013.01); *H01L 21/0254* (2013.01); *H01L 21/02598* (2013.01); *H01L 21/8252* (2013.01); *H01L 27/20* (2013.01); *H01L 29/2003* (2013.01); *H01L 29/41766* (2013.01); *H01L 29/80* (2013.01); *H03F 3/19* (2013.01); *H03F 3/21* (2013.01); *H03H 3/08* (2013.01); *H03H 9/46* (2013.01); *H04B 1/44* (2013.01); *H01L 21/0242* (2013.01); *H01L 21/02378* (2013.01); *H01L 21/02381* (2013.01); *H01L 21/02389* (2013.01); *H01L 41/183* (2013.01); *H01L 41/314* (2013.01);
(Continued)

(58) Field of Classification Search
USPC .......................................................... 257/76
See application file for complete search history.

(56) References Cited

U.S. PATENT DOCUMENTS

| 5,231,327 A | 7/1993 | Ketcham |
| 5,894,647 A | 4/1999 | Lakin |

(Continued)

FOREIGN PATENT DOCUMENTS

| JP | 2003-289106 A | 10/2003 |
| JP | 2010-068109 A | 3/2010 |

(Continued)

OTHER PUBLICATIONS

International Search Report for PCT/US2015/034560, dated Sep. 18, 2015.

(Continued)

*Primary Examiner* — Marcos D. Pizarro
*Assistant Examiner* — Lawrence C Tynes, Jr.
(74) *Attorney, Agent, or Firm* — Richard T. Ogawa; Ogawa P.C.

(57) ABSTRACT

A method of manufacture and structure for a monolithic single chip single crystal device. The method can include forming a first single crystal epitaxial layer overlying the substrate and forming one or more second single crystal epitaxial layers overlying the first single crystal epitaxial layer. The first single crystal epitaxial layer and the one or more second single crystal epitaxial layers can be processed to form one or more active or passive device components. Through this process, the resulting device includes a monolithic epitaxial stack integrating multiple circuit functions.

9 Claims, 26 Drawing Sheets

(51) Int. Cl.
*H01L 29/20* (2006.01)
*H03H 3/08* (2006.01)
*H03H 9/46* (2006.01)
*H03F 3/19* (2006.01)
*H04B 1/44* (2006.01)
*H03F 3/21* (2006.01)
*H01L 29/417* (2006.01)
*H01L 29/80* (2006.01)
*H01L 21/8252* (2006.01)
*H01L 27/20* (2006.01)
*H03H 9/02* (2006.01)
*H01L 41/18* (2006.01)
*H01L 41/37* (2013.01)
*H01L 41/314* (2013.01)

(52) U.S. Cl.
CPC ........ *H01L 41/37* (2013.01); *H03F 2200/165* (2013.01); *H03F 2200/171* (2013.01); *H03F 2200/294* (2013.01); *H03F 2200/451* (2013.01); *H03H 9/02007* (2013.01)

(56) References Cited

U.S. PATENT DOCUMENTS

| | | | |
|---|---|---|---|
| 6,051,907 | A | 4/2000 | Ylilammi |
| 6,114,635 | A | 9/2000 | Lakin et al. |
| 6,262,637 | B1 | 7/2001 | Bradley et al. |
| 6,377,137 | B1 | 4/2002 | Ruby |
| 6,384,697 | B1 | 5/2002 | Ruby |
| 6,472,954 | B1 | 10/2002 | Ruby et al. |
| 6,617,060 | B2 | 9/2003 | Weeks, Jr. et al. |
| 6,812,619 | B1 | 11/2004 | Kaitila et al. |
| 6,841,922 | B2 | 1/2005 | Aigner et al. |
| 6,864,619 | B2 | 3/2005 | Aigner et al. |
| 6,879,224 | B2 | 4/2005 | Frank |
| 6,909,340 | B2 | 6/2005 | Aigner et al. |
| 6,933,807 | B2 | 8/2005 | Marksteiner et al. |
| 7,112,860 | B2 * | 9/2006 | Saxler ............... H01L 27/20 257/416 |
| 7,250,360 | B2 | 7/2007 | Shealy et al. |
| 7,268,436 | B2 | 9/2007 | Aigner et al. |
| 7,365,619 | B2 | 4/2008 | Aigner et al. |
| 7,514,759 | B1 | 4/2009 | Mehta et al. |
| 7,875,910 | B2 | 1/2011 | Sheppard et al. |
| 7,982,363 | B2 | 7/2011 | Chitnis |
| 8,304,271 | B2 | 11/2012 | Huang et al. |
| 2003/0006409 | A1 * | 1/2003 | Ohba ............... H01L 21/0242 257/18 |
| 2005/0255234 | A1 | 11/2005 | Kanda et al. |
| 2006/0289901 | A1 | 12/2006 | Sheppard et al. |
| 2008/0284541 | A1 | 11/2008 | Chitnis |
| 2009/0033177 | A1 | 2/2009 | Itaya et al. |
| 2011/0140176 | A1 | 6/2011 | Briere |
| 2012/0305992 | A1 | 12/2012 | Marino et al. |
| 2013/0082235 | A1 * | 4/2013 | Gu ............... H01L 21/8258 257/9 |
| 2013/0176086 | A1 | 7/2013 | Bradley et al. |
| 2014/0117411 | A1 | 5/2014 | Kanaya |
| 2014/0132117 | A1 | 5/2014 | Larson, III |
| 2017/0264256 | A1 | 9/2017 | Gibb et al. |

FOREIGN PATENT DOCUMENTS

| | | |
|---|---|---|
| WO | WO 2005/034349 A1 | 4/2005 |
| WO | 2017171856 A1 | 10/2017 |
| WO | 2017222990 A1 | 12/2017 |

OTHER PUBLICATIONS

International Search Report and Written Opinion for International Patent Application No. PCT/US2018/013628, dated May 3, 2018.
Written Opinion for International Patent Application No. PCT/US2018/013628, dated May 3, 2018.
PCT International Search Report for Application No. PCT/US2019/018550, dated May 30, 2019.

* cited by examiner

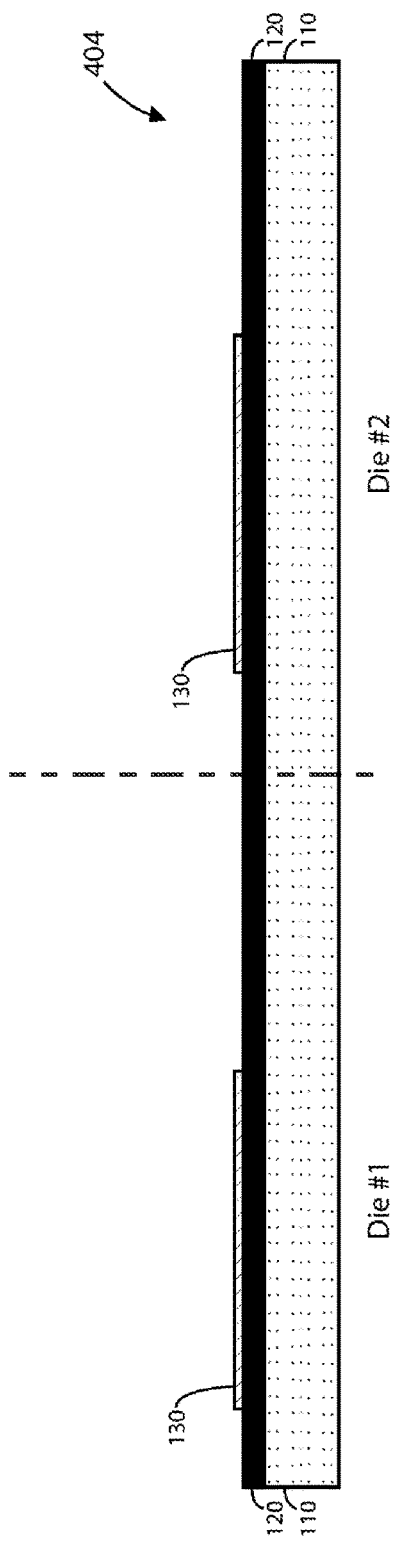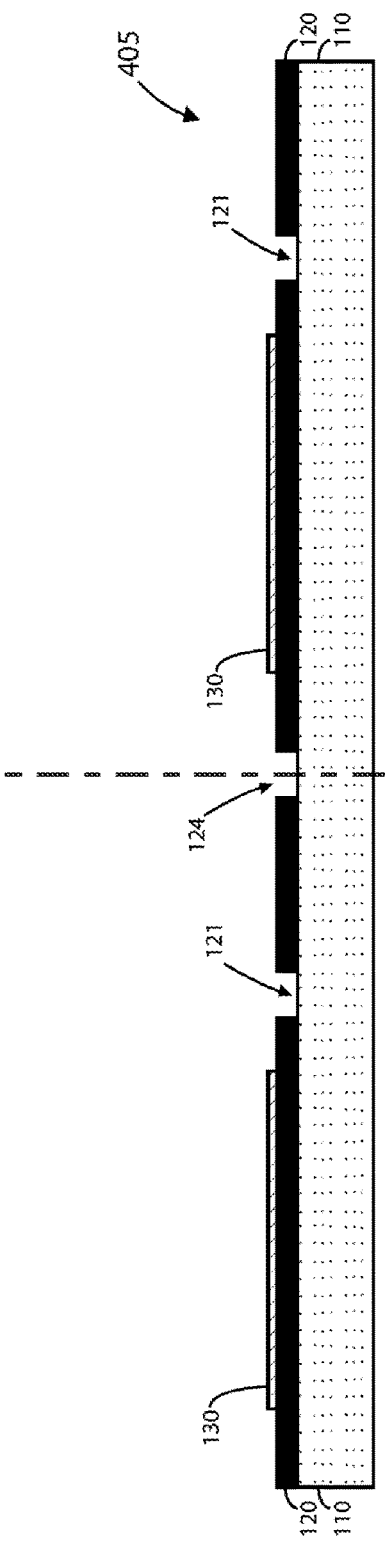

ic Filter Devices

MONOLITHIC SINGLE CHIP INTEGRATED RADIO FREQUENCY FRONT END MODULE CONFIGURED WITH SINGLE CRYSTAL ACOUSTIC FILTER DEVICES

CROSS-REFERENCES TO RELATED APPLICATIONS

The present application incorporates by reference, for all purposes, the following concurrently filed patent applications, all commonly owned: U.S. patent application Ser. No. 14/298,057, titled "RESONANCE CIRCUIT WITH A SINGLE CRYSTAL CAPACITOR DIELECTRIC MATERIAL," filed Jun. 6, 2014, U.S. patent application Ser. No. 14/298,076, titled "METHOD OF MANUFACTURE FOR SINGLE CRYSTAL CAPACITOR DIELECTRIC FOR A RESONANCE CIRCUIT," filed Jun. 6, 2014 (now U.S. Pat. No. 9,537,465 issued Jan. 3, 2017), U.S. patent application Ser. No. 14/298,100, titled "INTEGRATED CIRCUIT CONFIGURED WITH TWO OR MORE SINGLE CRYSTAL ACOUSTIC RESONATOR DEVICES," filed Jun. 6, 2014, U.S. patent application Ser. No. 14/341,314, titled "WAFER SCALE PACKAGING," filed Jul. 25, 2014, U.S. patent application Ser. No. 14/449,001, titled "MOBILE COMMUNICATION DEVICE CONFIGURED WITH A SINGLE CRYSTAL PIEZO RESONATOR STRUCTURE," filed Jul. 31, 2014, U.S. patent application Ser. No. 14/469,503, titled "MEMBRANE SUBSTRATE STRUCTURE FOR SINGLE CRYSTAL ACOUSTIC RESONATOR DEVICE," filed Aug. 26, 2014, and U.S. patent application Ser. No. 15/068,510, titled "METHOD OF MANUFACTURE FOR SINGLE CRYSTAL ACOUSTIC RESONATOR DEVICES USING MICRO-VIAS," filed Mar. 11, 2016, U.S. patent application Ser. No. 15/221,358, titled "METHOD OF MANUFACTURE FOR SINGLE CRYSTAL ACOUSTIC RESONATOR DEVICES USING MICRO-VIAS," filed Jul. 27, 2016, and U.S. patent application Ser. No. 15/341,218, titled "STRUCTURE AND METHOD OF MANUFACTURE FOR ACOUSTIC RESONATOR OR FILTER DEVICES USING IMPROVED FABRICATION CONDITIONS AND PERIMETER STRUCTURE MODIFICATIONS," filed Nov. 2, 2016.

BACKGROUND OF THE INVENTION

According to the present invention, techniques generally related to electronic devices are provided. More particularly, the present invention provides techniques related to a method of manufacture and structure for monolithic single chip single crystal devices, bulk acoustic wave resonator devices, single crystal filter and resonator devices, Power Amplifiers (PA), Low Noise Amplifiers (LNA), switches and the like. Merely by way of example, the invention has been applied to a single crystal resonator device for a communication device, mobile device, computing device, among others.

Mobile telecommunication devices have been successfully deployed world-wide. Over a billion mobile devices, including cell phones and smartphones, were manufactured in a single year and unit volume continues to increase year-over-year. With ramp of 4G/LTE in about 2012, and explosion of mobile data traffic, data rich content is driving the growth of the smartphone segment—which is expected to reach 2B per annum within the next few years. Coexistence of new and legacy standards and thirst for higher data rate requirements is driving RF complexity in smartphones. Unfortunately, limitations exist with conventional RF technology that is problematic, and may lead to drawbacks in the future.

Existing RF Front End modules are built by assembling multiple discrete die level device components on a single laminate or PC board. Disadvantages of this approach include the sourcing of multiple device level die, electrical connection losses due to connecting disparate device die and increased assembly complexity, size, and cost.

From the above, it is seen that techniques for improving electronic communication devices are highly desirable. The present invention overcomes the disadvantages described above by integrating the different device types in a single chip built upon common single crystal epitaxial layers.

BRIEF SUMMARY OF THE INVENTION

The present invention relates generally to an RF Front End Module. More specifically, the present invention relates generally to the monolithic integration of passive and active electronic devices. Moreover, the present invention provides proposed configurations for monolithic single chip integration of single crystal devices, including single crystal bulk acoustic wave resonator devices, single crystal filter and resonator devices, Power Amplifiers (PA), Low Noise Amplifiers (LNA), switches, and the like.

According to an example, the present invention provides a method of manufacturing a monolithic single chip single crystal device. The method can include providing a substrate having a substrate surface region; forming a first single crystal epitaxial layer overlying the substrate surface region; processing the first single crystal epitaxial layer to form one or more active or passive device components; forming one or more second single crystal epitaxial layers overlying the first single crystal epitaxial layer; and processing the one or more second single crystal epitaxial layers to form one or more active or passive device components. The first single crystal epitaxial layer and the one or more second single crystal epitaxial layers can form a monolithic epitaxial stack integrating multiple circuit functions.

The substrate can be selected from one of the following: a silicon substrate, a sapphire substrate, silicon carbide substrate, a GaN bulk substrate, a GaN template, an AlN bulk, an AlN template, and an $Al_xGa_{1-x}N$ template. In a specific example, the first single crystal epitaxial layer comprises an aluminum nitride (AlN) material used for the RF filter functionality, and wherein the first single crystal epitaxial layer is characterized by a thickness of about 0.01 um to about 10.0 um. In a specific example, at least one of the one or more second single crystal epitaxial layer comprises a single crystal aluminum gallium nitride ($Al_xGa_{1-x}N$) material, and wherein the second single crystal epitaxial layer is characterized by a composition of $0 \leq X < 1.0$ and a thickness of about 200 nm to about 1200 nm or a thickness of about 10 nm to about 40 nm. The one or more active or passive device components can include one or more filters, amplifiers, switches, or the like.

In an example, the method can further include forming a cap layer overlying the third epitaxial layer, wherein the cap layer comprises gallium nitride (GaN) materials. In a specific example, the cap layer is characterized by a thickness of about 0.10 nm to about 5.0 nm.

According to an example, the present invention also provides the resulting structure of the monolithic single chip single crystal device. The device includes a substrate having a substrate surface region; a first single crystal epitaxial layer formed overlying the substrate surface region, the first single crystal epitaxial layer having one or more active or passive device components; and one or more second single crystal epitaxial layers formed overlying the first single crystal epitaxial layer, the one or more second single crystal epitaxial layers having one or more active or passive device components. The first single crystal epitaxial layer and the one or more second single crystal epitaxial layers are formed as a monolithic epitaxial stack integrating multiple circuit functions.

In an example, the monolithically integrated components can be implemented in an epitaxial stack structure. Compared to conventional embodiments, which combine various discretely packaged components onto a larger packaged device, the present invention provides a method to grow multiple single crystal device layers to monolithically integrate unpackaged active and passive single crystal components into a single chip package. This method is possible due to the use of the single crystal bulk fabrication processes described in this application. Using such a method, the resulting device can benefit from size reduction, improved performance, lower integrated cost, and a faster time to market.

One or more benefits are achieved over pre-existing techniques using the invention. In particular, the present device can be manufactured with lower integrated cost by using a smaller PCB area and fewer passive components. The monolithic single chip design of the present invention reduces the complexity of the front end module by eliminating wire bonds and discrete component packaging. Device performance can also be improved due to optimal impedance match, lower signal loss, and less assembly variability. Depending upon the embodiment, one or more of these benefits may be achieved. Of course, there can be other variations, modifications, and alternatives.

A further understanding of the nature and advantages of the invention may be realized by reference to the latter portions of the specification and attached drawings.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which:

FIGS. 4D and 4E are simplified diagrams illustrating an alternative method for conducting the method step of forming a topside micro-trench as described in FIG. 4A.

DETAILED DESCRIPTION OF THE INVENTION

The present invention relates generally to an RF Front End Module. More specifically, the present invention relates generally to the monolithic integration of passive and active electronic devices. Moreover, the present invention provides proposed configurations for monolithic single chip integration of single crystal devices, including single crystal bulk acoustic wave resonator devices, single crystal filter and resonator devices, Power Amplifiers (PA), Low Noise Amplifiers (LNA), switches, and the like.

Figure 1A:
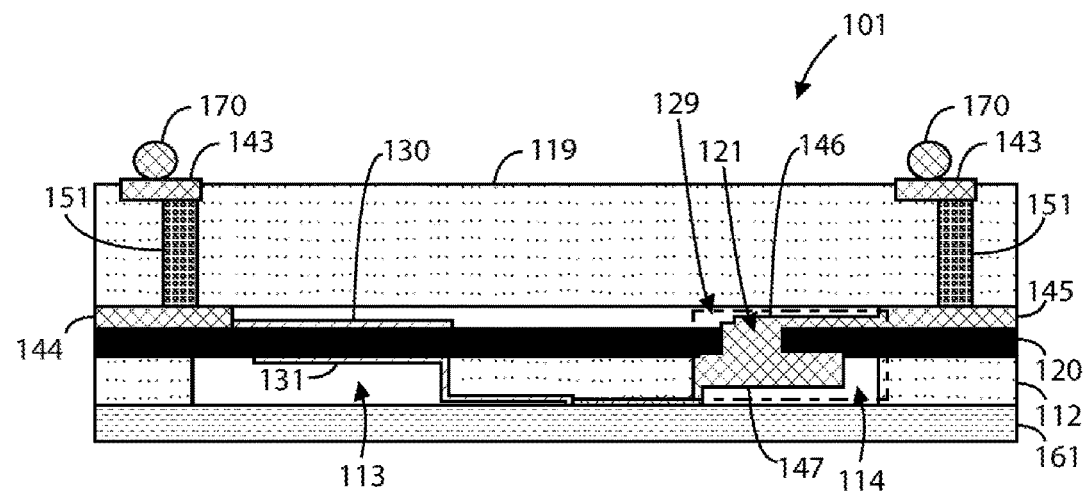
FIG. 1A is a simplified diagram illustrating an acoustic resonator device having topside interconnections according to an example of the present invention.

FIG. 1A is a simplified diagram illustrating an acoustic resonator device 101 having topside interconnections according to an example of the present invention. As shown, device 101 includes a thinned seed substrate 112 with an overlying single crystal piezoelectric layer 120, which has a micro-via 129. The micro-via 129 can include a topside micro-trench 121, a topside metal plug 146, a backside trench 114, and a backside metal plug 147. Although device 101 is depicted with a single micro-via 129, device 101 may have multiple micro-vias. A topside metal electrode 130 is formed overlying the piezoelectric layer 120. A top cap structure is bonded to the piezoelectric layer 120. This top cap structure includes an interposer substrate 119 with one or more through-vias 151 that are connected to one or more top bond pads 143, one or more bond pads 144, and topside metal 145 with topside metal plug 146. Solder balls 170 are electrically coupled to the one or more top bond pads 143.

The thinned substrate 112 has the first and second backside trenches 113, 114. A backside metal electrode 131 is formed underlying a portion of the thinned seed substrate 112, the first backside trench 113, and the topside metal electrode 130. The backside metal plug 147 is formed underlying a portion of the thinned seed substrate 112, the second backside trench 114, and the topside metal 145. This backside metal plug 147 is electrically coupled to the topside metal plug 146 and the backside metal electrode 131. A backside cap structure 161 is bonded to the thinned seed substrate 112, underlying the first and second backside trenches 113, 114. Further details relating to the method of manufacture of this device will be discussed starting from FIG. 2.

Figure 1B:
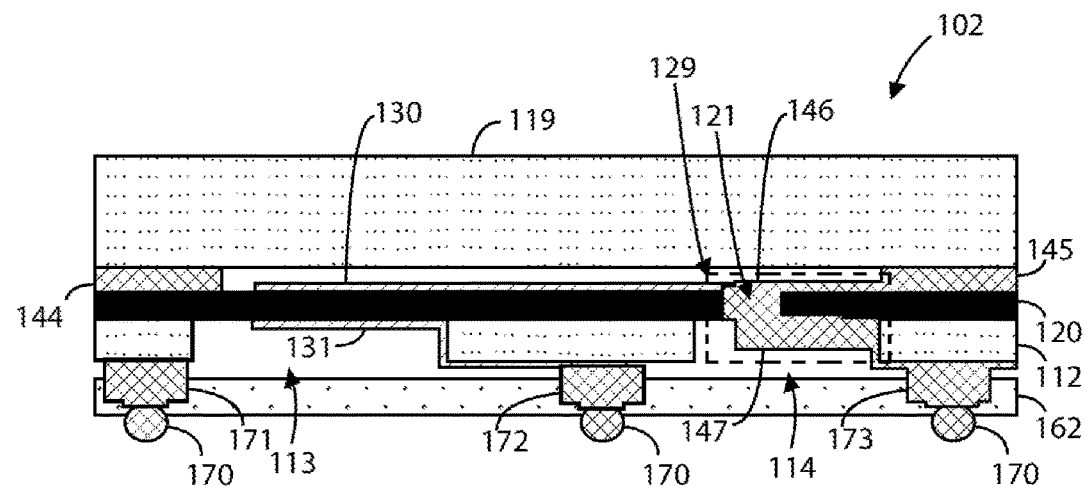
FIG. 1B is a simplified diagram illustrating an acoustic resonator device having bottom-side interconnections according to an example of the present invention.

FIG. 1B is a simplified diagram illustrating an acoustic resonator device 102 having backside interconnections according to an example of the present invention. As shown, device 101 includes a thinned seed substrate 112 with an overlying piezoelectric layer 120, which has a micro-via 129. The micro-via 129 can include a topside micro-trench 121, a topside metal plug 146, a backside trench 114, and a backside metal plug 147. Although device 102 is depicted with a single micro-via 129, device 102 may have multiple micro-vias. A topside metal electrode 130 is formed overlying the piezoelectric layer 120. A top cap structure is bonded to the piezoelectric layer 120. This top cap structure 119 includes bond pads which are connected to one or more bond pads 144 and topside metal 145 on piezoelectric layer 120. The topside metal 145 includes a topside metal plug 146.

The thinned substrate 112 has the first and second backside trenches 113, 114. A backside metal electrode 131 is formed underlying a portion of the thinned seed substrate 112, the first backside trench 113, and the topside metal electrode 130. A backside metal plug 147 is formed underlying a portion of the thinned seed substrate 112, the second backside trench 114, and the topside metal plug 146. This backside metal plug 147 is electrically coupled to the topside metal plug 146. A backside cap structure 162 is bonded to the thinned seed substrate 112, underlying the first and second backside trenches. One or more backside bond pads (171, 172, 173) are formed within one or more portions of the backside cap structure 162. Solder balls 170 are electrically coupled to the one or more backside bond pads 171-173. Further details relating to the method of manufacture of this device will be discussed starting from FIG. 14A.

Figure 1C:
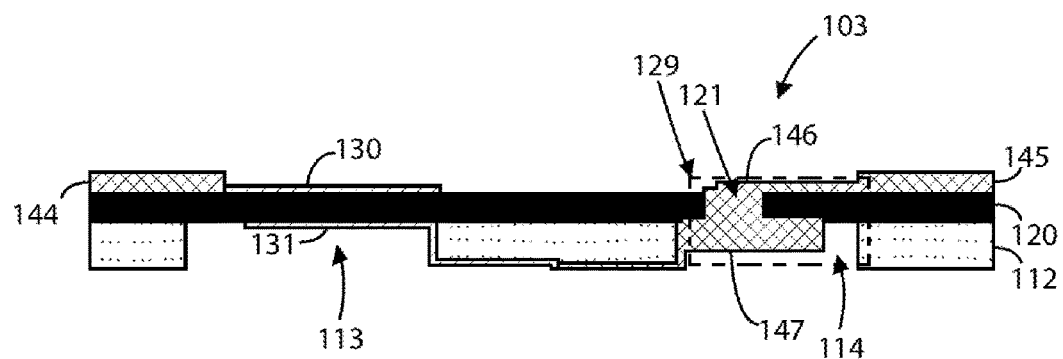
FIG. 1C is a simplified diagram illustrating an acoustic resonator device having interposer/cap-free structure interconnections according to an example of the present invention.

FIG. 1C is a simplified diagram illustrating an acoustic resonator device having interposer/cap-free structure interconnections according to an example of the present invention. As shown, device 103 includes a thinned seed substrate 112 with an overlying single crystal piezoelectric layer 120, which has a micro-via 129. The micro-via 129 can include a topside micro-trench 121, a topside metal plug 146, a backside trench 114, and a backside metal plug 147. Although device 103 is depicted with a single micro-via 129, device 103 may have multiple micro-vias. A topside metal electrode 130 is formed overlying the piezoelectric layer 120. The thinned substrate 112 has the first and second backside trenches 113, 114. A backside metal electrode 131 is formed underlying a portion of the thinned seed substrate 112, the first backside trench 113, and the topside metal electrode 130. A backside metal plug 147 is formed underlying a portion of the thinned seed substrate 112, the second backside trench 114, and the topside metal 145. This backside metal plug 147 is electrically coupled to the topside metal plug 146 and the backside metal electrode 131. Further details relating to the method of manufacture of this device will be discussed starting from FIG. 2.

Figure 1D:
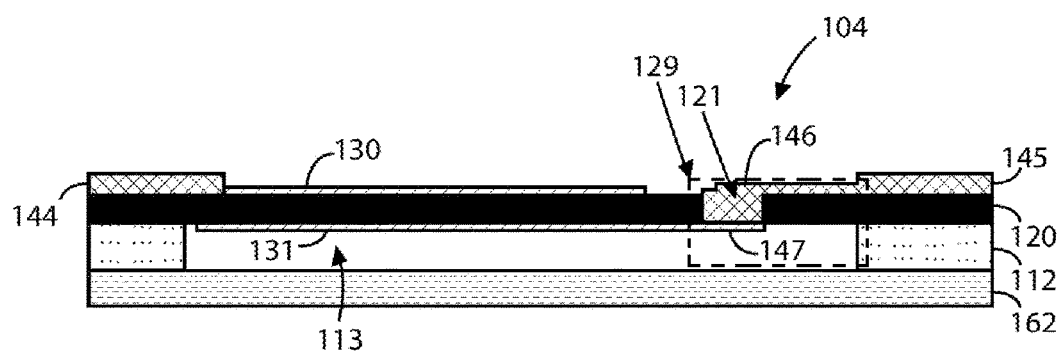
FIG. 1D is a simplified diagram illustrating an acoustic resonator device having interposer/cap-free structure interconnections with a shared backside trench according to an example of the present invention.

FIG. 1D is a simplified diagram illustrating an acoustic resonator device having interposer/cap-free structure interconnections with a shared backside trench according to an example of the present invention. As shown, device 104 includes a thinned seed substrate 112 with an overlying single crystal piezoelectric layer 120, which has a micro-via 129. The micro-via 129 can include a topside micro-trench 121, a topside metal plug 146, and a backside metal 147. Although device 104 is depicted with a single micro-via 129, device 104 may have multiple micro-vias. A topside metal electrode 130 is formed overlying the piezoelectric layer 120. The thinned substrate 112 has a first backside trench 113. A backside metal electrode 131 is formed underlying a portion of the thinned seed substrate 112, the first backside trench 113, and the topside metal electrode 130. A backside metal 147 is formed underlying a portion of the thinned seed substrate 112, the second backside trench 114, and the topside metal 145. This backside metal 147 is electrically coupled to the topside metal plug 146 and the backside metal electrode 131. Further details relating to the method of manufacture of this device will be discussed starting from FIG. 2.

Figure 2:
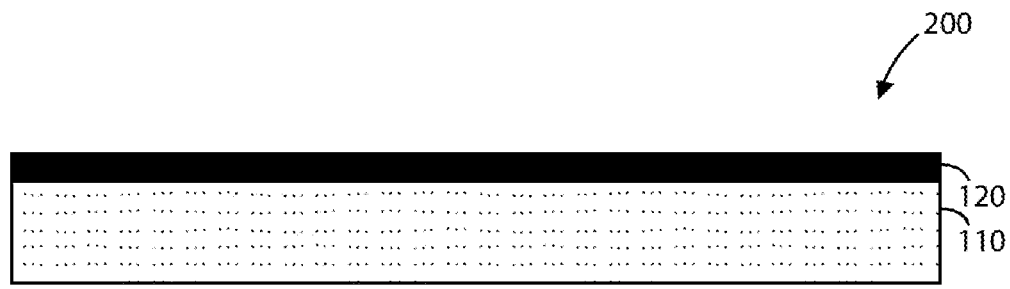
FIGS. 2 and 3 are simplified diagrams illustrating steps for a method of manufacture for an acoustic resonator device according to an example of the present invention.
Figure 3:
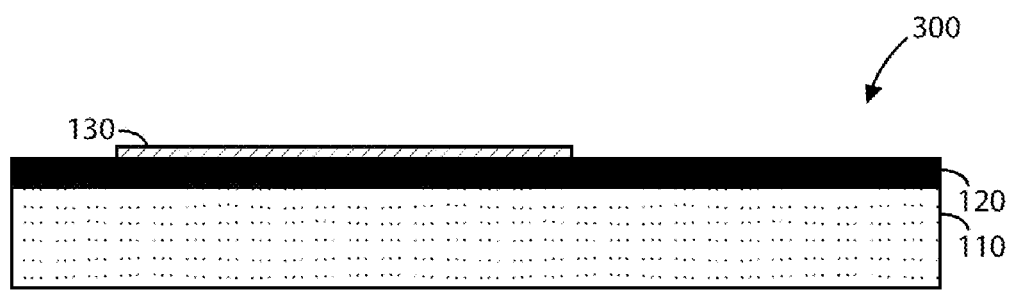

FIGS. 2 and 3 are simplified diagrams illustrating steps for a method of manufacture for an acoustic resonator device according to an example of the present invention. This method illustrates the process for fabricating an acoustic resonator device similar to that shown in FIG. 1A. FIG. 2 can represent a method step of providing a partially processed piezoelectric substrate. As shown, device 102 includes a seed substrate 110 with a piezoelectric layer 120 formed overlying. In a specific example, the seed substrate can include silicon, silicon carbide, aluminum oxide, or single crystal aluminum gallium nitride materials, or the like. The piezoelectric layer 120 can include a piezoelectric single crystal layer or a thin film piezoelectric single crystal layer.

FIG. 3 can represent a method step of forming a top side metallization or top resonator metal electrode 130. In a specific example, the topside metal electrode 130 can include a molybdenum, aluminum, ruthenium, or titanium material, or the like and combinations thereof. This layer can be deposited and patterned on top of the piezoelectric layer by a lift-off process, a wet etching process, a dry etching process, a metal printing process, a metal laminating process, or the like. The lift-off process can include a sequential process of lithographic patterning, metal deposition, and lift-off steps to produce the topside metal layer. The wet/dry etching processes can includes sequential processes of metal deposition, lithographic patterning, metal deposition, and metal etching steps to produce the topside metal layer. Those of ordinary skill in the art will recognize other variations, modifications, and alternatives.

Figure 4A:
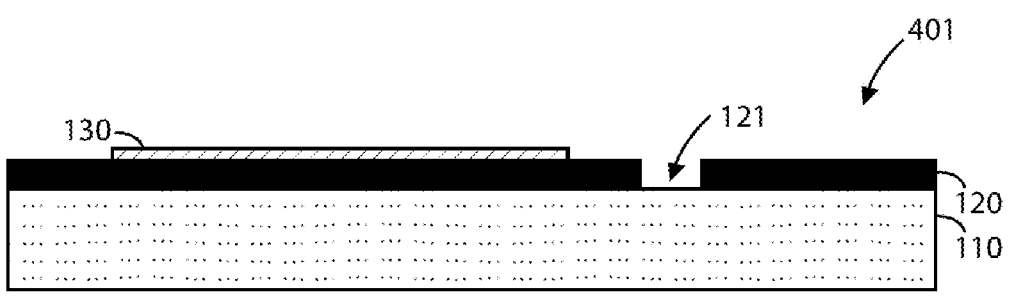
FIG. 4A is a simplified diagram illustrating a step for a method creating a topside micro-trench according to an example of the present invention.
Figure 4B:
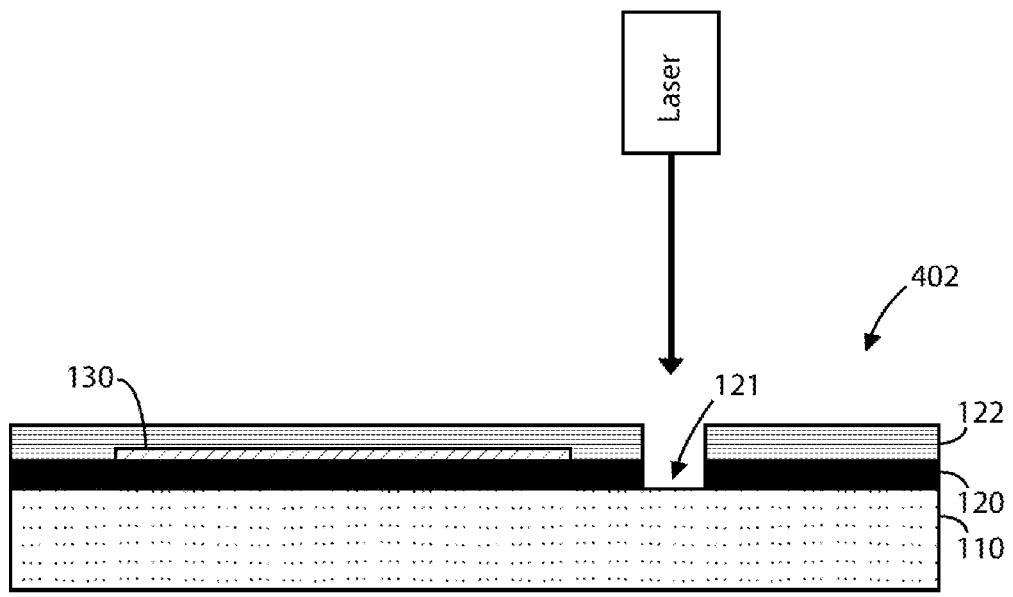
FIGS. 4B and 4C are simplified diagrams illustrating alternative methods for conducting the method step of forming a topside micro-trench as described in FIG. 4A.
Figure 4C:
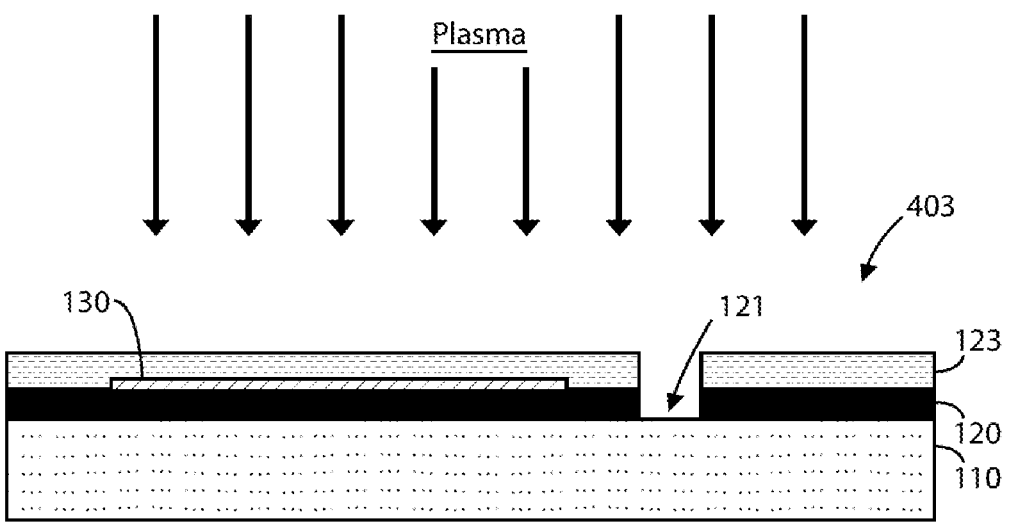

FIG. 4A is a simplified diagram illustrating a step for a method of manufacture for an acoustic resonator device 401 according to an example of the present invention. This figure can represent a method step of forming one or more topside micro-trenches 121 within a portion of the piezoelectric layer 120. This topside micro-trench 121 can serve as the main interconnect junction between the top and bottom sides of the acoustic membrane, which will be developed in later method steps. In an example, the topside micro-trench 121 is extends all the way through the piezoelectric layer 120 and stops in the seed substrate 110. This topside micro-trench 121 can be formed through a dry etching process, a laser drilling process, or the like. FIGS. 4B and 4C describe these options in more detail.

FIGS. 4B and 4C are simplified diagrams illustrating alternative methods for conducting the method step as described in FIG. 4A. As shown, FIG. 4B represents a method step of using a laser drill, which can quickly and accurately form the topside micro-trench 121 in the piezoelectric layer 120. In an example, the laser drill can be used to form nominal 50 um holes, or holes between 10 um and 500 um in diameter, through the piezoelectric layer 120 and stop in the seed substrate 110 below the interface between layers 120 and 110. A protective layer 122 can be formed overlying the piezoelectric layer 120 and the topside metal electrode 130. This protective layer 122 can serve to protect the device from laser debris and to provide a mask for the etching of the topside micro-via 121. In a specific example, the laser drill can be an 11 W high power diode-pumped UV laser, or the like. This mask 122 can be subsequently removed before proceeding to other steps. The mask may also be omitted from the laser drilling process, and air flow can be used to remove laser debris.

FIG. 4C can represent a method step of using a dry etching process to form the topside micro-trench 121 in the piezoelectric layer 120. As shown, a lithographic masking layer 123 can be forming overlying the piezoelectric layer 120 and the topside metal electrode 130. The topside micro-trench 121 can be formed by exposure to plasma, or the like.

FIGS. 4D and 4E are simplified diagrams illustrating an alternative method for conducting the method step as described in FIG. 4A. These figures can represent the method step of manufacturing multiple acoustic resonator devices simultaneously. In FIG. 4D, two devices are shown on Die #1 and Die #2, respectively. FIG. 4E shows the process of forming a micro-via 121 on each of these dies while also etching a scribe line 124 or dicing line. In an example, the etching of the scribe line 124 singulates and relieves stress in the piezoelectric single crystal layer 120.

Figure 5:
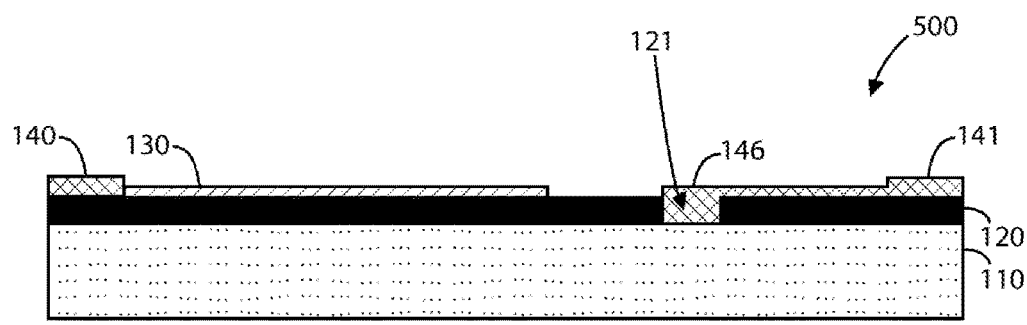
FIGS. 5 to 8 are simplified diagrams illustrating steps for a method of manufacture for an acoustic resonator device according to an example of the present invention.

FIGS. 5 to 8 are simplified diagrams illustrating steps for a method of manufacture for an acoustic resonator device according to an example of the present invention. FIG. 5 can represent the method step of forming one or more bond pads 140 and forming a topside metal 141 electrically coupled to at least one of the bond pads 140. The topside metal 141 can include a topside metal plug 146 formed within the topside micro-trench 121. In a specific example, the topside metal plug 146 fills the topside micro-trench 121 to form a topside portion of a micro-via.

In an example, the bond pads 140 and the topside metal 141 can include a gold material or other interconnect metal material depending upon the application of the device. These metal materials can be formed by a lift-off process, a wet etching process, a dry etching process, a screen-printing process, an electroplating process, a metal printing process, or the like. In a specific example, the deposited metal materials can also serve as bond pads for a cap structure, which will be described below.

Figure 6:
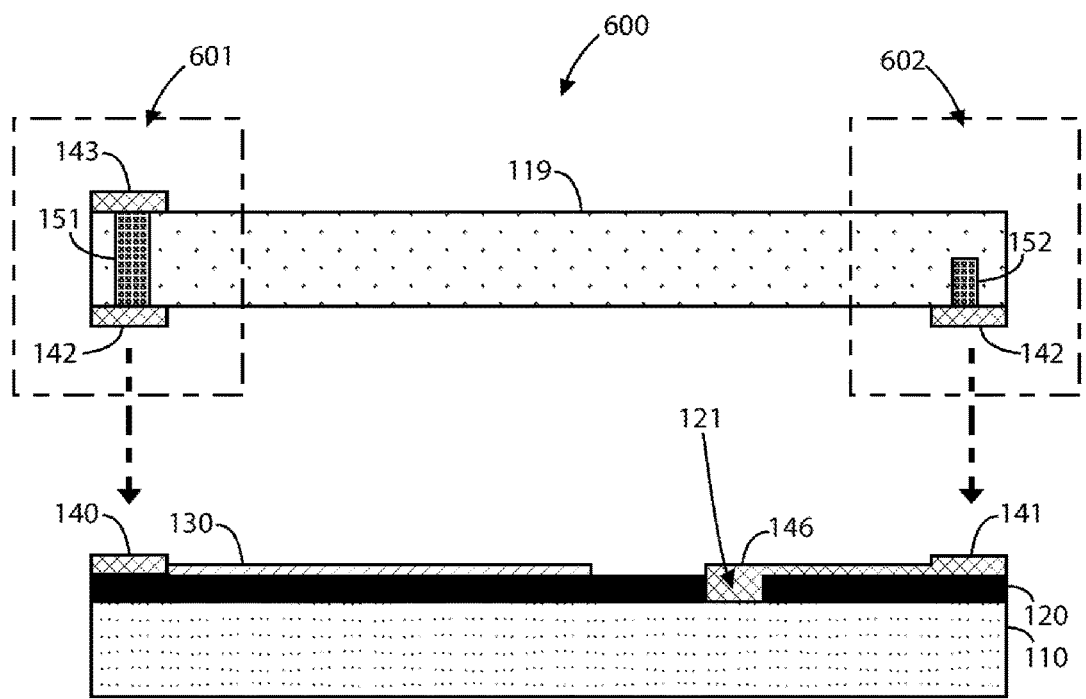

FIG. 6 can represent a method step for preparing the acoustic resonator device for bonding, which can be a hermetic bonding. As shown, a top cap structure is positioned above the partially processed acoustic resonator device as described in the previous figures. The top cap structure can be formed using an interposer substrate 119 in two configurations: fully processed interposer version 601 (through glass via) and partially processed interposer version 602 (blind via version). In the 601 version, the interposer substrate 119 includes through-via structures 151 that extend through the interposer substrate 119 and are electrically coupled to bottom bond pads 142 and top bond pads 143. In the 602 version, the interposer substrate 119 includes blind via structures 152 that only extend through a portion of the interposer substrate 119 from the bottom side. These blind via structures 152 are also electrically coupled to bottom bond pads 142. In a specific example, the interposer substrate can include a silicon, glass, smart-glass, or other like material.

Figure 7:
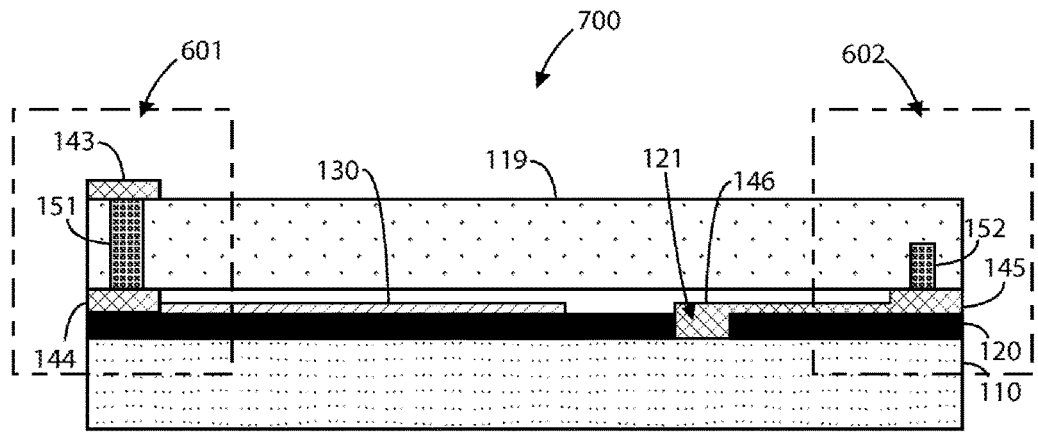
Figure 8:
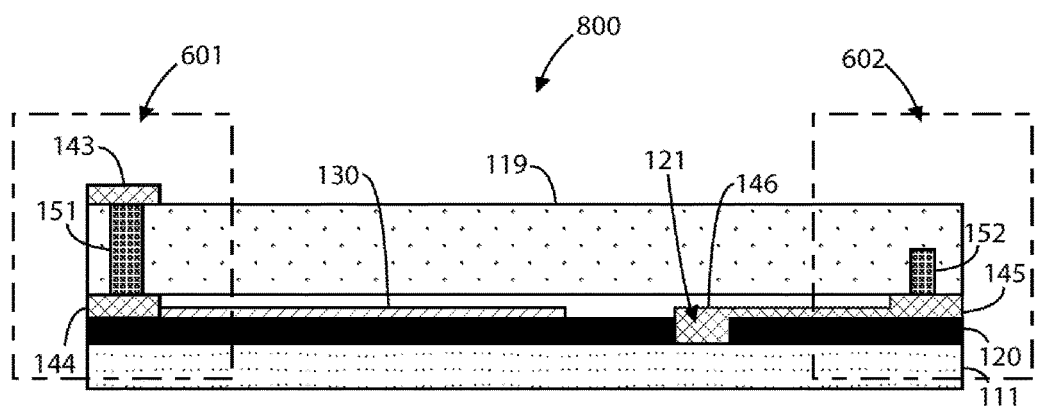

FIG. 7 can represent a method step of bonding the top cap structure to the partially processed acoustic resonator device. As shown, the interposer substrate 119 is bonded to the piezoelectric layer by the bond pads (140, 142) and the topside metal 141, which are now denoted as bond pad 144 and topside metal 145. This bonding process can be done using a compression bond method or the like. FIG. 8 can represent a method step of thinning the seed substrate 110, which is now denoted as thinned seed substrate 111. This substrate thinning process can include grinding and etching processes or the like. In a specific example, this process can include a wafer backgrinding process followed by stress removal, which can involve dry etching, CMP polishing, or annealing processes.

Figure 9A:
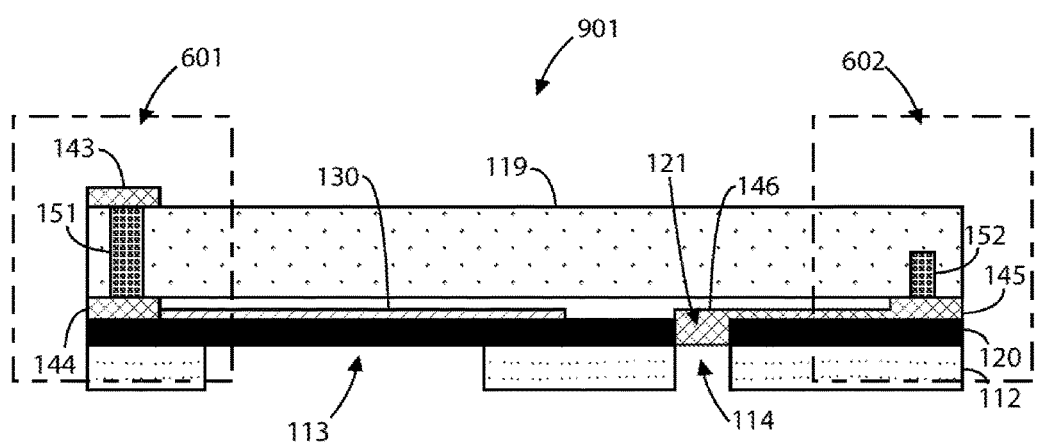
FIG. 9A is a simplified diagram illustrating a method step for forming backside trenches according to an example of the present invention.

FIG. 9A is a simplified diagram illustrating a step for a method of manufacture for an acoustic resonator device 901 according to an example of the present invention. FIG. 9A can represent a method step for forming backside trenches 113 and 114 to allow access to the piezoelectric layer from the backside of the thinned seed substrate 111. In an example, the first backside trench 113 can be formed within the thinned seed substrate 111 and underlying the topside metal electrode 130. The second backside trench 114 can be formed within the thinned seed substrate 111 and underlying the topside micro-trench 121 and topside metal plug 146. This substrate is now denoted thinned substrate 112. In a specific example, these trenches 113 and 114 can be formed using deep reactive ion etching (DRIE) processes, Bosch processes, or the like. The size, shape, and number of the trenches may vary with the design of the acoustic resonator device. In various examples, the first backside trench may be formed with a trench shape similar to a shape of the topside metal electrode or a shape of the backside metal electrode. The first backside trench may also be formed with a trench shape that is different from both a shape of the topside metal electrode and the backside metal electrode.

Figure 9B:
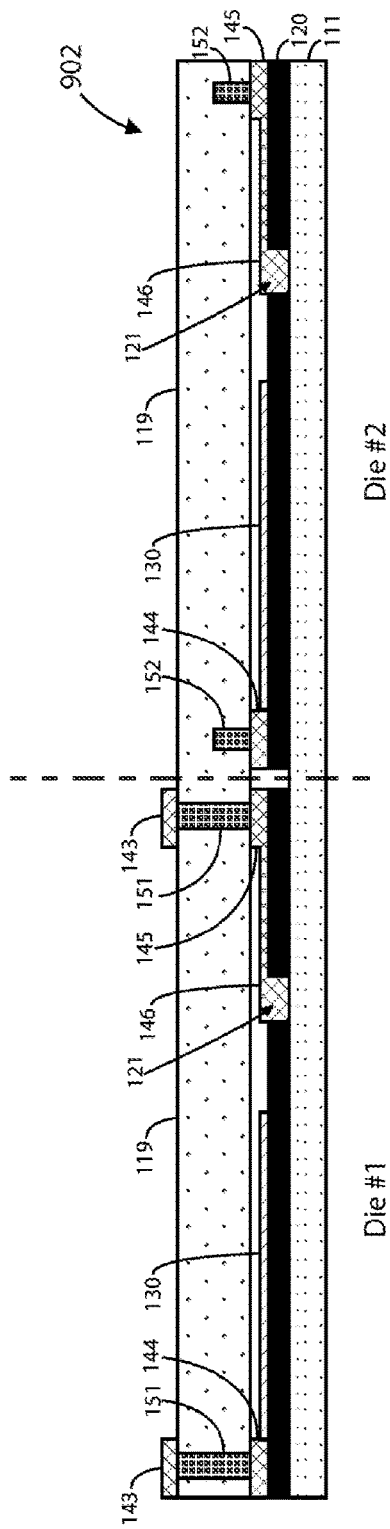
FIGS. 9B and 9C are simplified diagrams illustrating an alternative method for conducting the method step of forming backside trenches, as described in FIG. 9A, and simultaneously singulating a seed substrate according to an embodiment of the present invention.
Figure 9C:
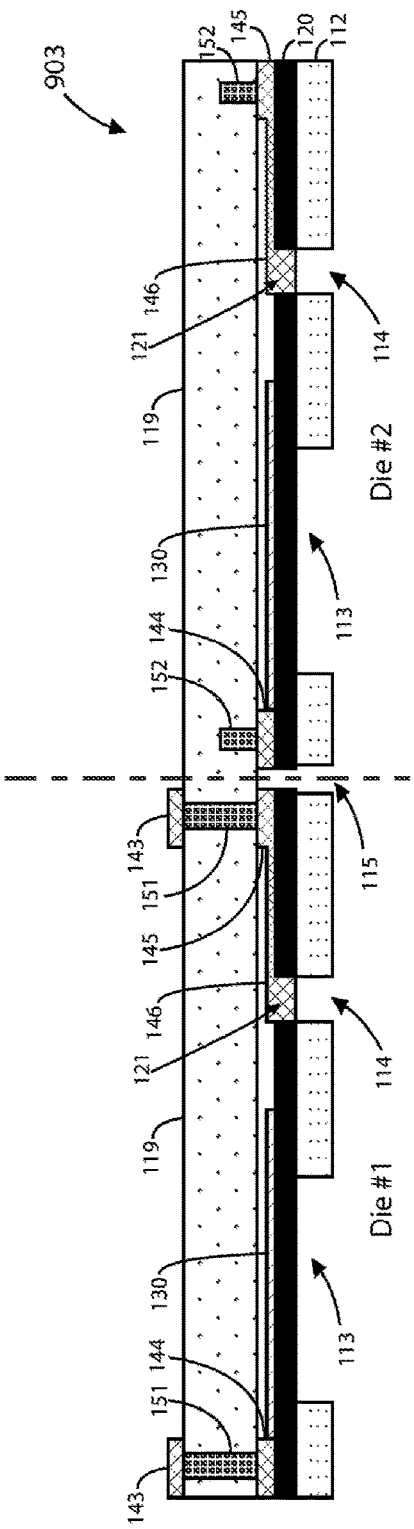

FIGS. 9B and 9C are simplified diagrams illustrating an alternative method for conducting the method step as described in FIG. 9A. Like FIGS. 4D and 4E, these figures can represent the method step of manufacturing multiple acoustic resonator devices simultaneously. In FIG. 9B, two devices with cap structures are shown on Die #1 and Die #2, respectively. FIG. 9C shows the process of forming backside trenches (113, 114) on each of these dies while also etching a scribe line 115 or dicing line. In an example, the etching of the scribe line 115 provides an optional way to singulate the backside wafer 112.

Figure 10:
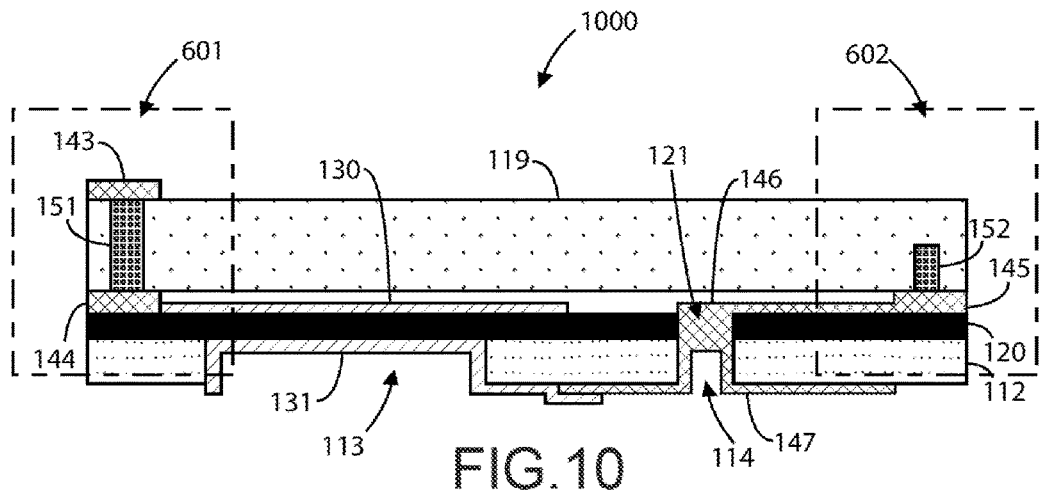
FIG. 10 is a simplified diagram illustrating a method step forming backside metallization and electrical interconnections between top and bottom sides of a resonator according to an example of the present invention.

FIG. 10 is a simplified diagram illustrating a step for a method of manufacture for an acoustic resonator device 1000 according to an example of the present invention. This figure can represent a method step of forming a backside metal electrode 131 and a backside metal plug 147 within the backside trenches of the thinned seed substrate 112. In an example, the backside metal electrode 131 can be formed underlying one or more portions of the thinned substrate 112, within the first backside trench 113, and underlying the topside metal electrode 130. This process completes the resonator structure within the acoustic resonator device. The backside metal plug 147 can be formed underlying one or more portions of the thinned substrate 112, within the second backside trench 114, and underlying the topside micro-trench 121. The backside metal plug 147 can be electrically coupled to the topside metal plug 146 and the backside metal electrode 131. In a specific example, the backside metal electrode 130 can include a molybdenum, aluminum, ruthenium, or titanium material, or the like and combinations thereof. The backside metal plug can include a gold material, low resistivity interconnect metals, electrode metals, or the like. These layers can be deposited using the deposition methods described previously.

Figure 11A:
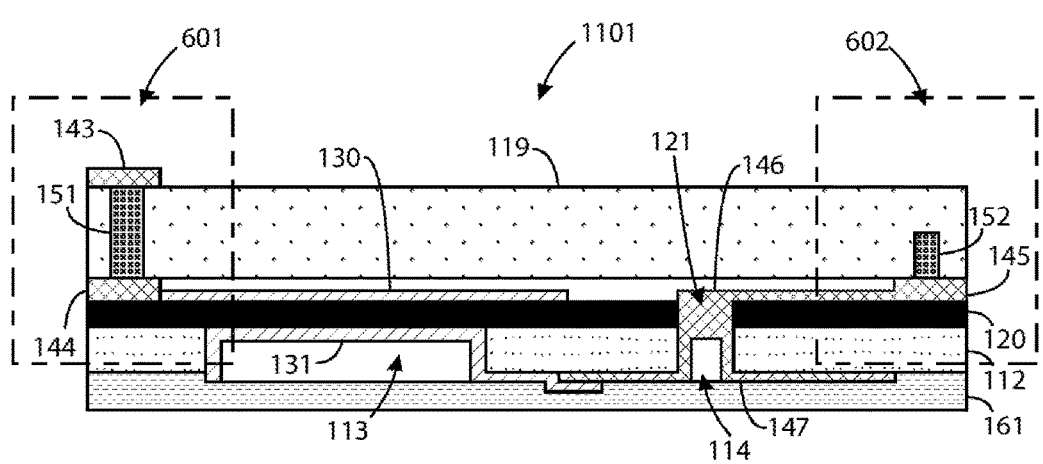
FIGS. 11A and 11B are simplified diagrams illustrating alternative steps for a method of manufacture for an acoustic resonator device according to an example of the present invention.
Figure 11B:
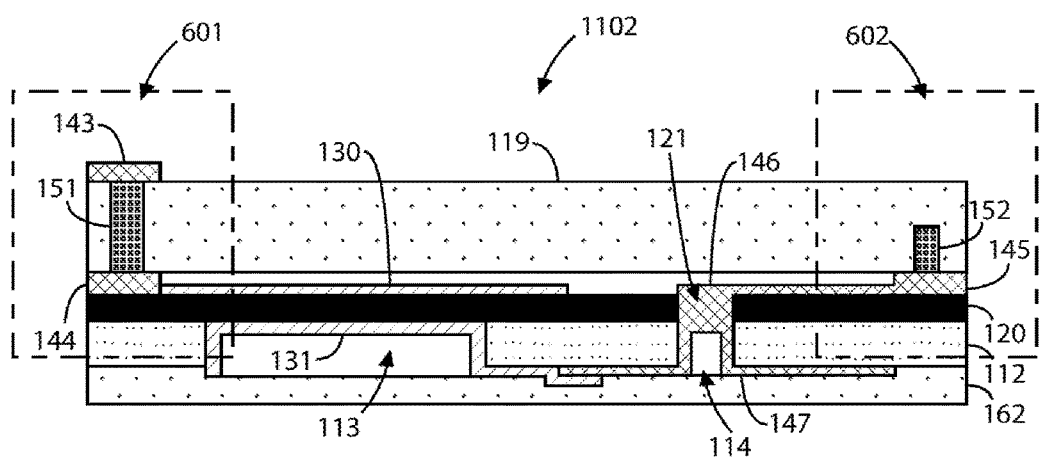

FIGS. 11A and 11B are simplified diagrams illustrating alternative steps for a method of manufacture for an acoustic resonator device according to an example of the present invention. These figures show methods of bonding a backside cap structure underlying the thinned seed substrate 112. In FIG. 11A, the backside cap structure is a dry film cap 161, which can include a permanent photo-imageable dry film such as a solder mask, polyimide, or the like. Bonding this cap structure can be cost-effective and reliable, but may not produce a hermetic seal. In FIG. 11B, the backside cap structure is a substrate 162, which can include a silicon, glass, or other like material. Bonding this substrate can provide a hermetic seal, but may cost more and require additional processes. Depending upon application, either of these backside cap structures can be bonded underlying the first and second backside vias.

Figure 12A:
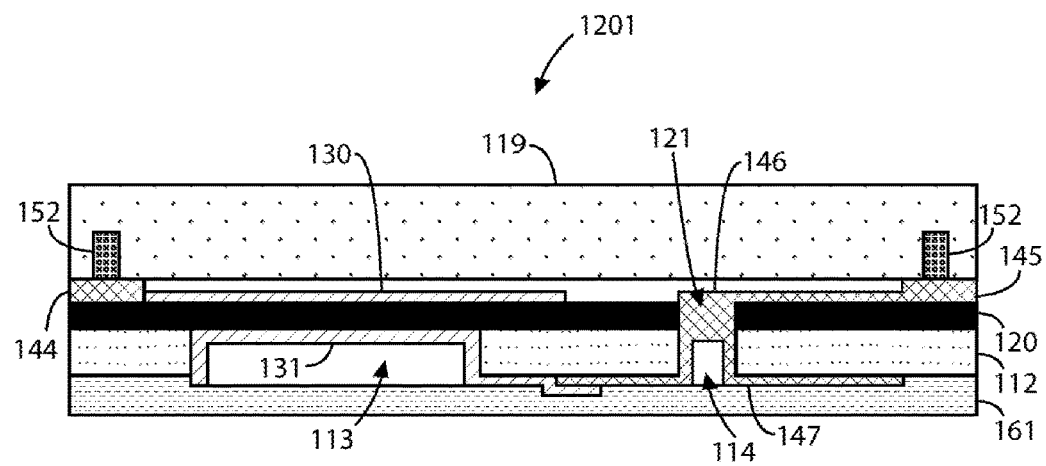
FIGS. 12A to 12E are simplified diagrams illustrating steps for a method of manufacture for an acoustic resonator device using a blind via interposer according to an example of the present invention.
Figure 12B:
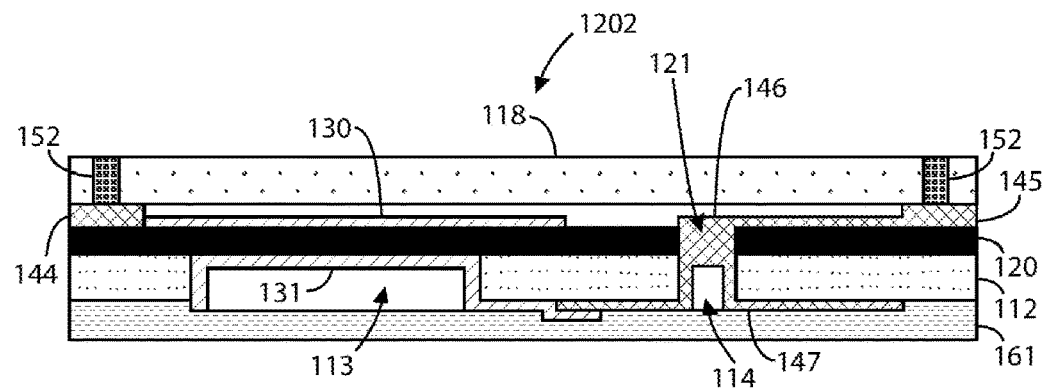
Figure 12C:
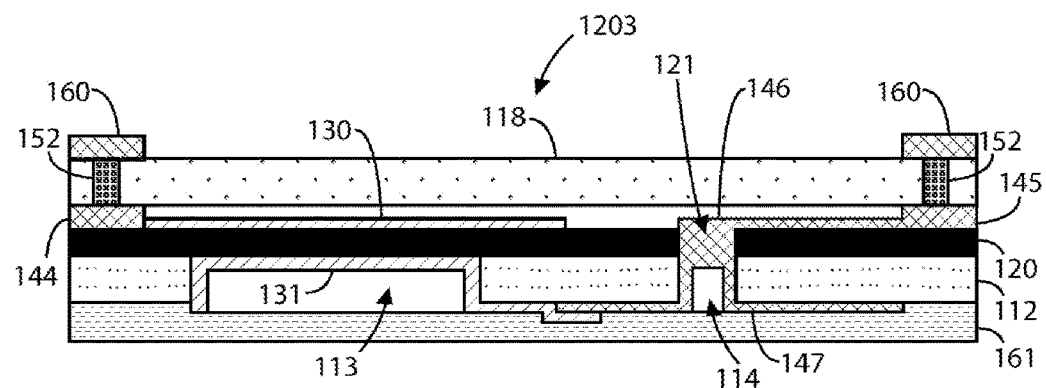
Figure 12D:
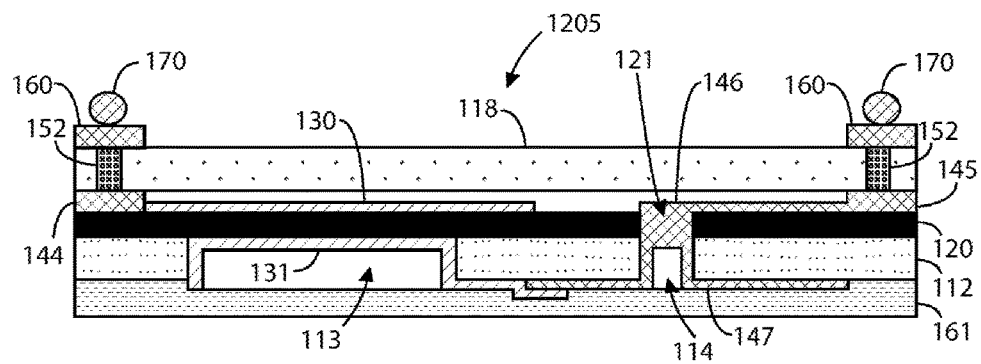
Figure 12E:
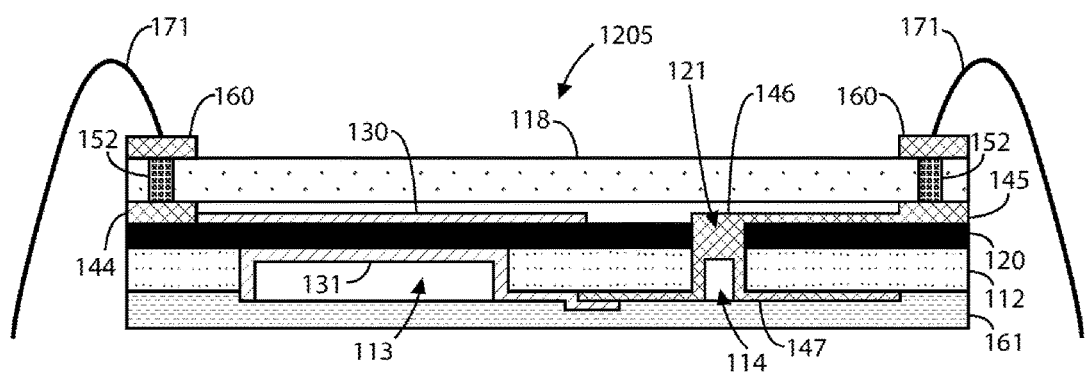

FIGS. 12A to 12E are simplified diagrams illustrating steps for a method of manufacture for an acoustic resonator device according to an example of the present invention. More specifically, these figures describe additional steps for processing the blind via interposer "602" version of the top cap structure. FIG. 12A shows an acoustic resonator device 1201 with blind vias 152 in the top cap structure. In FIG. 12B, the interposer substrate 119 is thinned, which forms a thinned interposer substrate 118, to expose the blind vias 152. This thinning process can be a combination of a grinding process and etching process as described for the thinning of the seed substrate. In FIG. 12C, a redistribution layer (RDL) process and metallization process can be applied to create top cap bond pads 160 that are formed overlying the blind vias 152 and are electrically coupled to the blind vias 152. As shown in FIG. 12D, a ball grid array (BGA) process can be applied to form solder balls 170 overlying and electrically coupled to the top cap bond pads 160. This process leaves the acoustic resonator device ready for wire bonding 171, as shown in FIG. 12E.

In an example, the present invention provides a method of manufacture and structure of a monolithic single-chip single crystal device. The monolithic design uses a common single crystal material layer stack to integrate both passive and active device elements in a single chip. This design can be applied to a variety of device components, such single crystal bulk acoustic resonators, filters, power amplifiers (PAs), switches, low noise amplifiers (LNAs), and the like. These components can be integrated as a mobile wireless front-end module (FEM) or other type of FEM. In a specific example, this monolithic single-chip single crystal device can be a single crystal III-nitride single chip integrated front end module (SCIFEM). Furthermore, a CMOS based controller chip can be integrated into a package with the SCIFEM chip to provide a complete communications RF FEM.

Figure 13A:
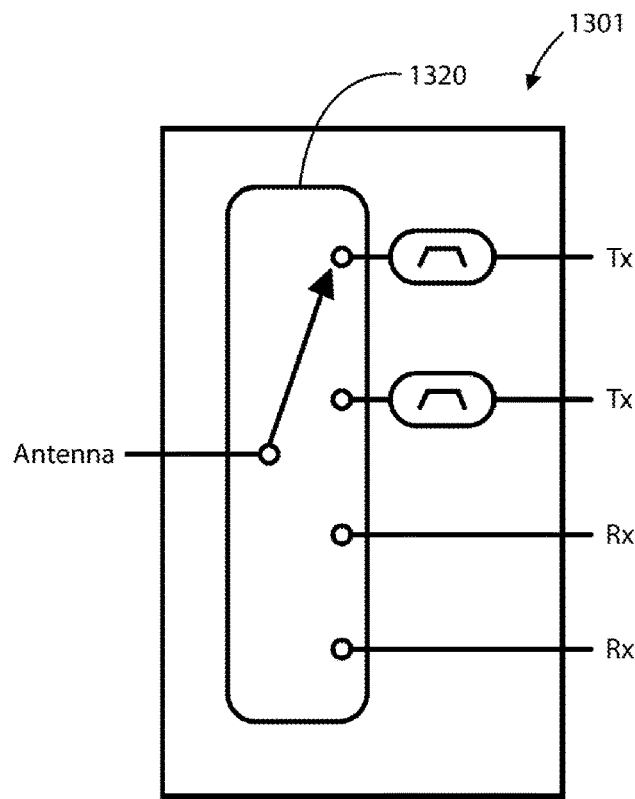
FIGS. 13A through 13E are simplified circuit diagrams illustrating various monolithic single chip single crystal devices according various examples of the present invention.
Figure 13B:
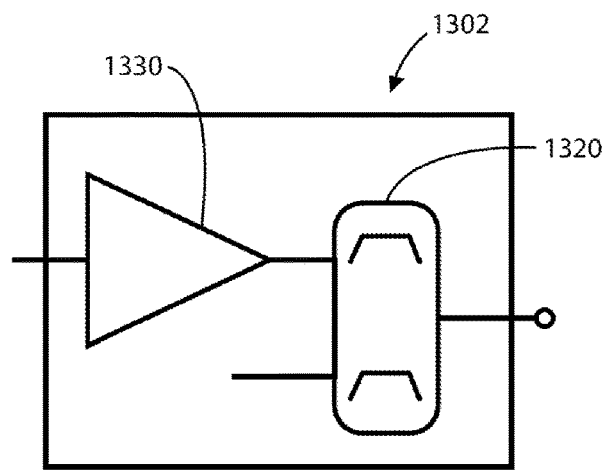
Figure 13C:
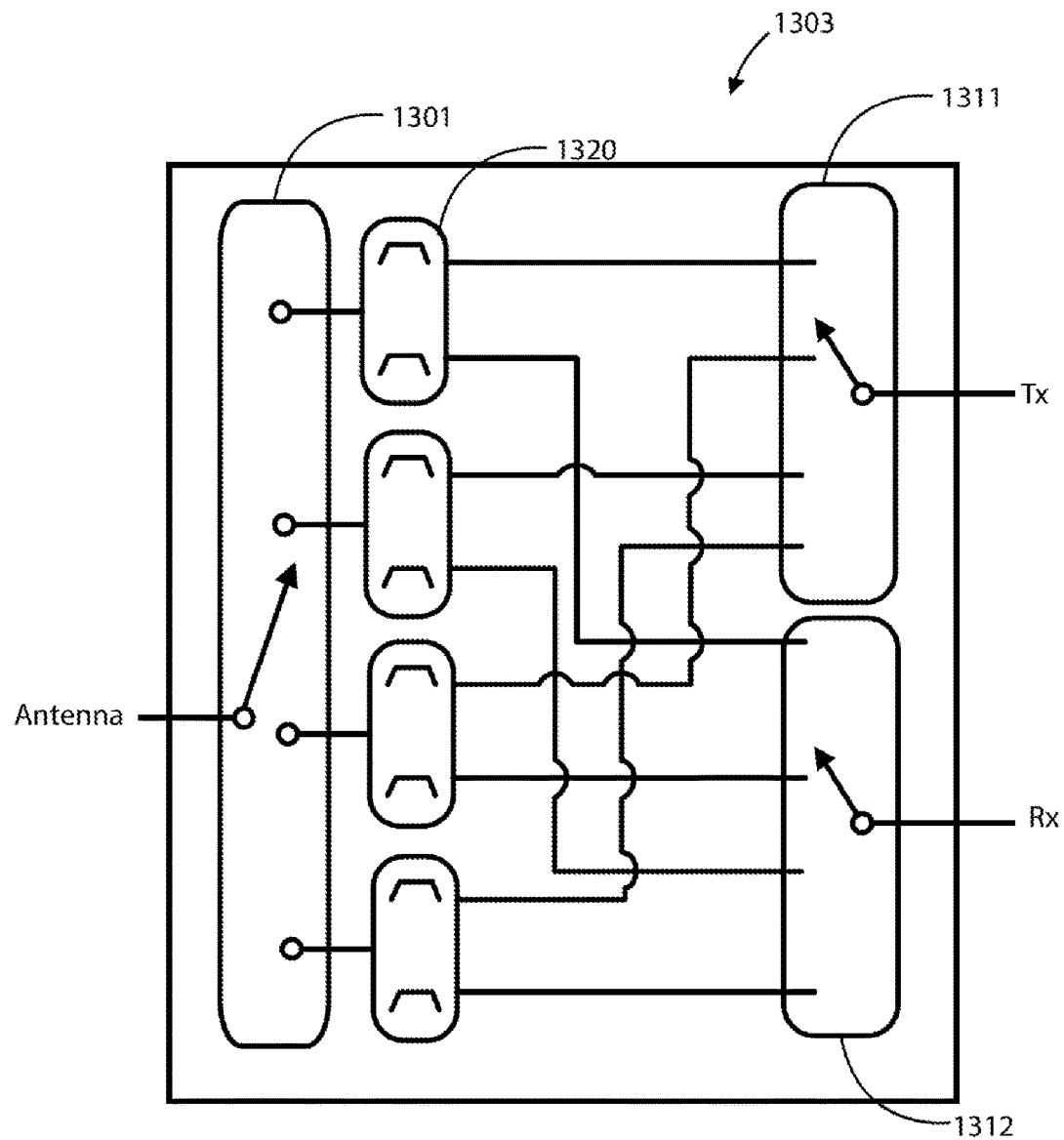
Figure 13D:
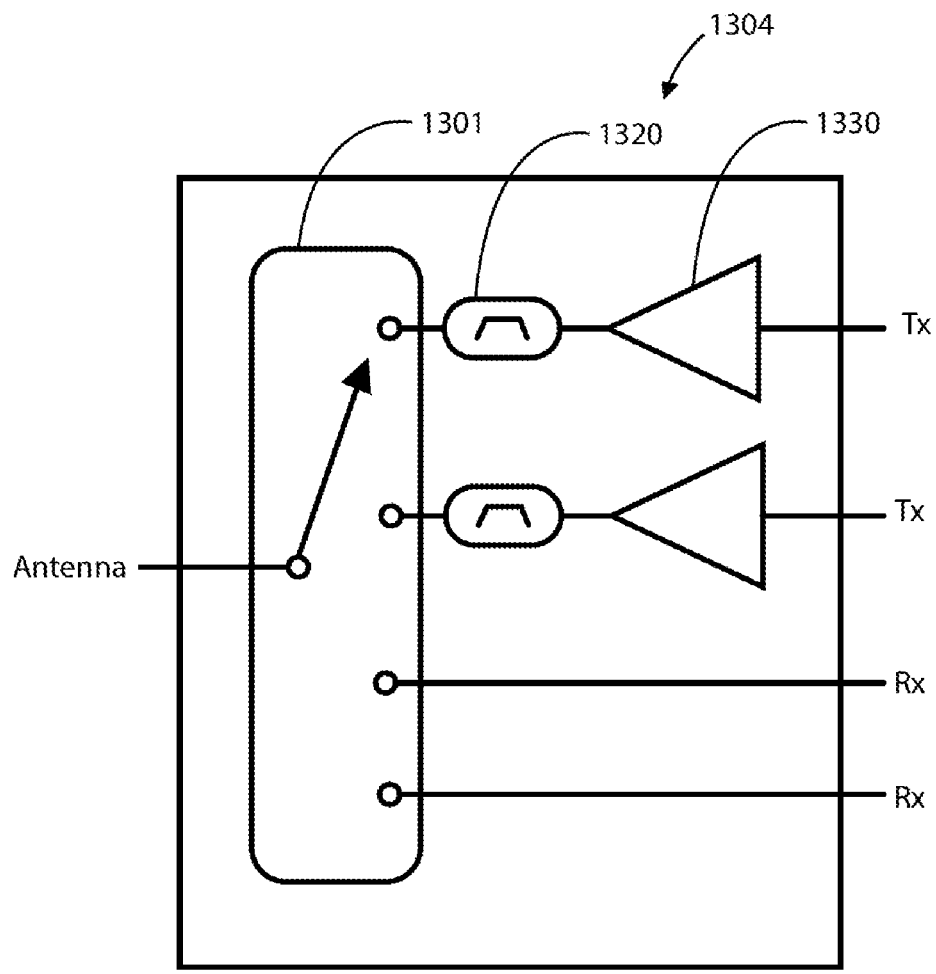
Figure 13E:
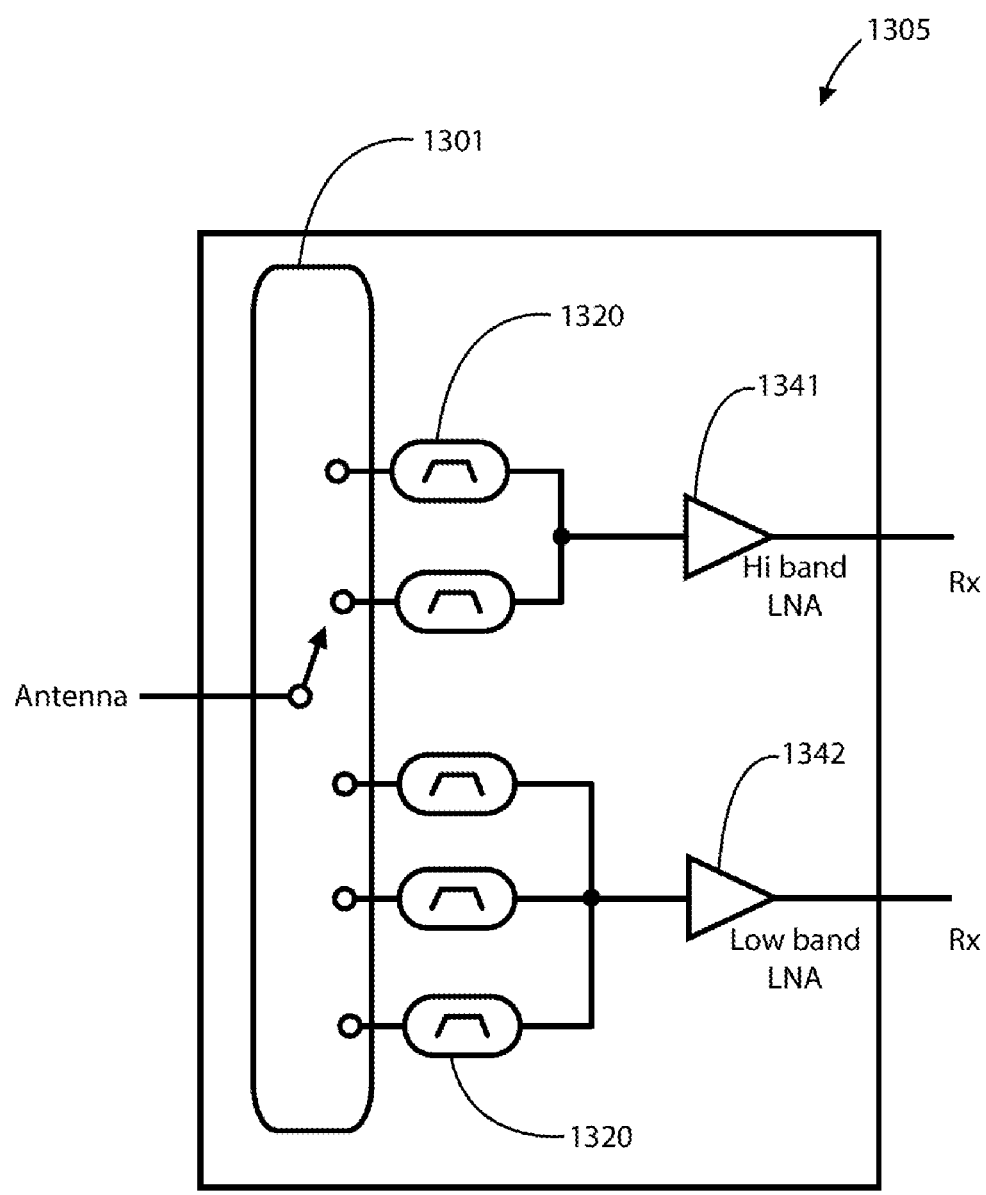

FIGS. 13A through 13E are simplified circuit diagrams illustrating various monolithic single chip single crystal devices according various examples of the present invention. FIG. 13A shows an antenna switch module 1301, which monolithically integrates a series of switches 1310. FIG. 13B shows a PA duplexer (PAD) 1302, which monolithically integrates a filter 1320 and a PA 1330. FIG. 13C shows a switched duplexer bank 1303, which monolithically integrates an antenna switch module 1301, filters 1320, a transmit switch module 1311, and a receive switch module 1312. FIG. 13D shows a transmit module 1304, which monolithically integrates an antenna switch module 1301, filters 1320, and PAs 1330. FIG. 13E shows a receive diversity module 1305, which monolithically integrates filters 1320, an antenna switch module 1301, a high band LNA 1341 and a low band LNA 1342. These are merely examples, and those of ordinary skill in the art will recognize other variations, modifications, and alternatives.

Figure 14:
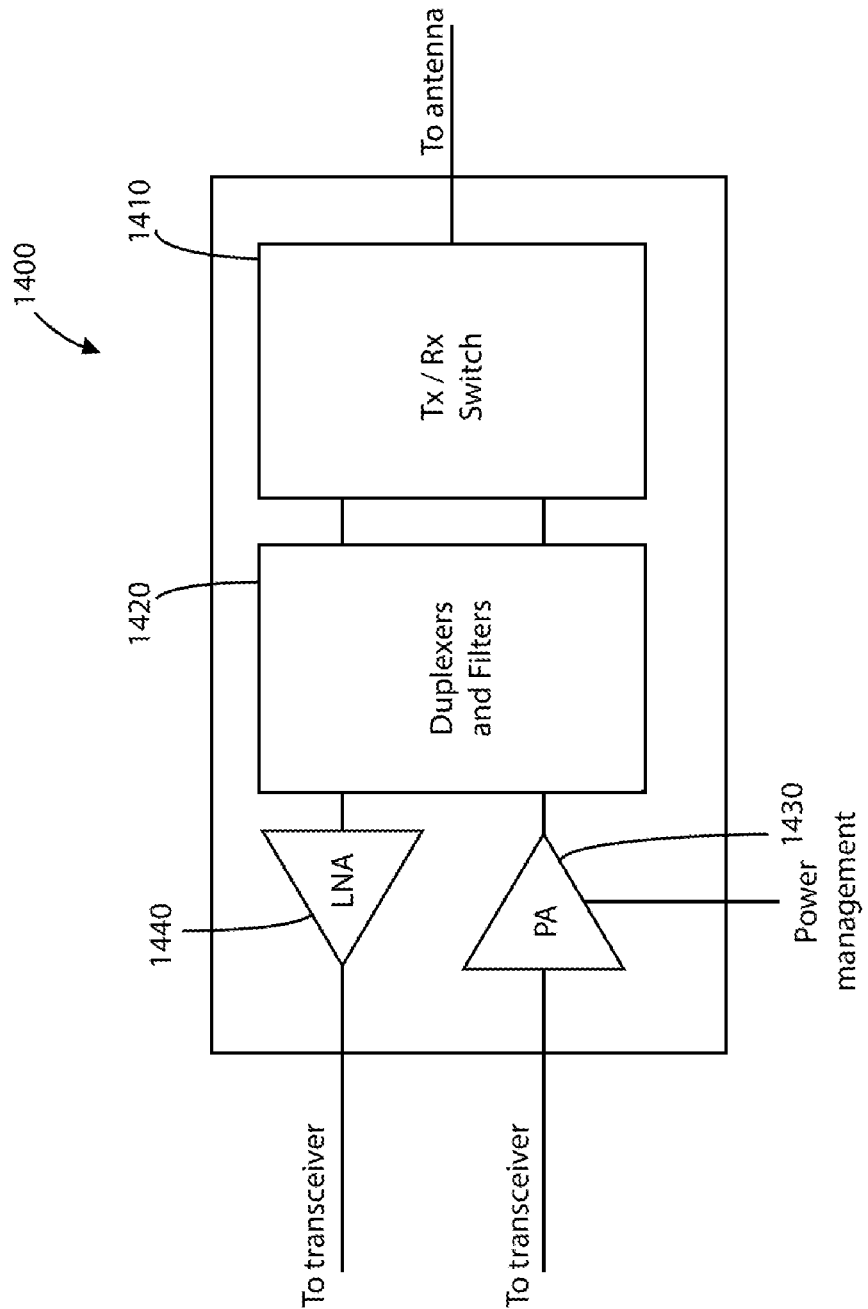
FIG. 14 is a simplified circuit diagram illustrating a monolithic single chip single crystal device integrated multiple circuit functions according an examples of the present invention.

FIG. 14 shows a monolithically integrated system 1400 with an LNA 1440 and a PA 1430 coupled to duplexers and filters 1420, which are coupled to transmit and receive switches 1410. These integrated components can include those that were described in FIGS. 13A-13E. Of course, there can be other variations, modifications, and alternatives.

Figure 15A:
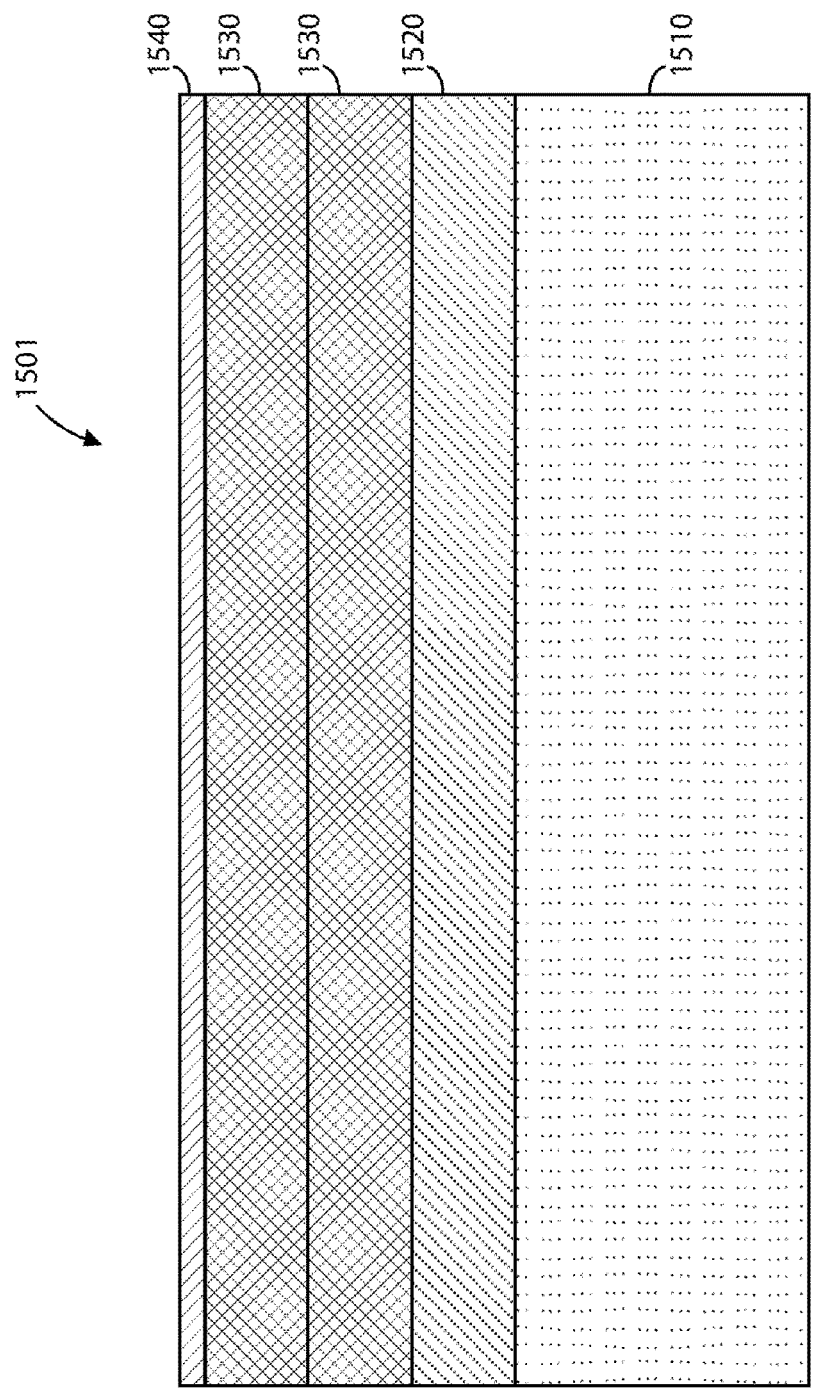
FIGS. 15A-15E are simplified diagrams illustrating cross-sectional views of monolithic single chip single crystal devices according to various example of the present invention.

FIGS. 15A-15E are a simplified diagrams illustrating cross-sectional views of monolithic single chip single crystal devices according to various examples of the present invention. In FIG. 15A, a substrate 1510 is provided as a foundation for an epitaxial film stack. The substrate can include silicon, silicon carbide, or other like materials. As shown in device 1501, a first epitaxial layer 1520 can be formed overlying the substrate. In a specific example, this first epitaxial layer can include single crystal aluminum nitride (AlN) materials and can have a thickness ranging from about 0.01 um to about 10.0 um. This epitaxial film can be grown using processes described previously and can be configured for switch/amplifier/filter device applications.

One or more second epitaxial layers 1530 can be formed overlying the first epitaxial layer. In an example, these second epitaxial layers can include single crystal aluminum gallium nitride ($Al_xGa_{1-x}N$) materials and can be configured for switch/amplifier/filter applications or other passive or active components. In a specific example, at least one of the second layers can be characterized by a composition of $0 \leq X < 1.0$ and can have a thickness ranging from about 200 nm to about 1200 nm. In another specific example, at least one of the second layers can be characterized by a composition of $0.10 \leq X < 1.0$ and can have a thickness ranging from about 10 nm to about 40 nm. The one or more second epitaxial layers can also be grown using the previously described processes. Also, the monolithic device 1400 can include a cap layer 1540, which can include gallium nitride (GaN) materials or the like. The cap layer can have a thickness ranging from about 0.10 nm to about 5.0 nm and can be used to prevent oxidation of the one or more second epitaxial layers.

Figure 15B:
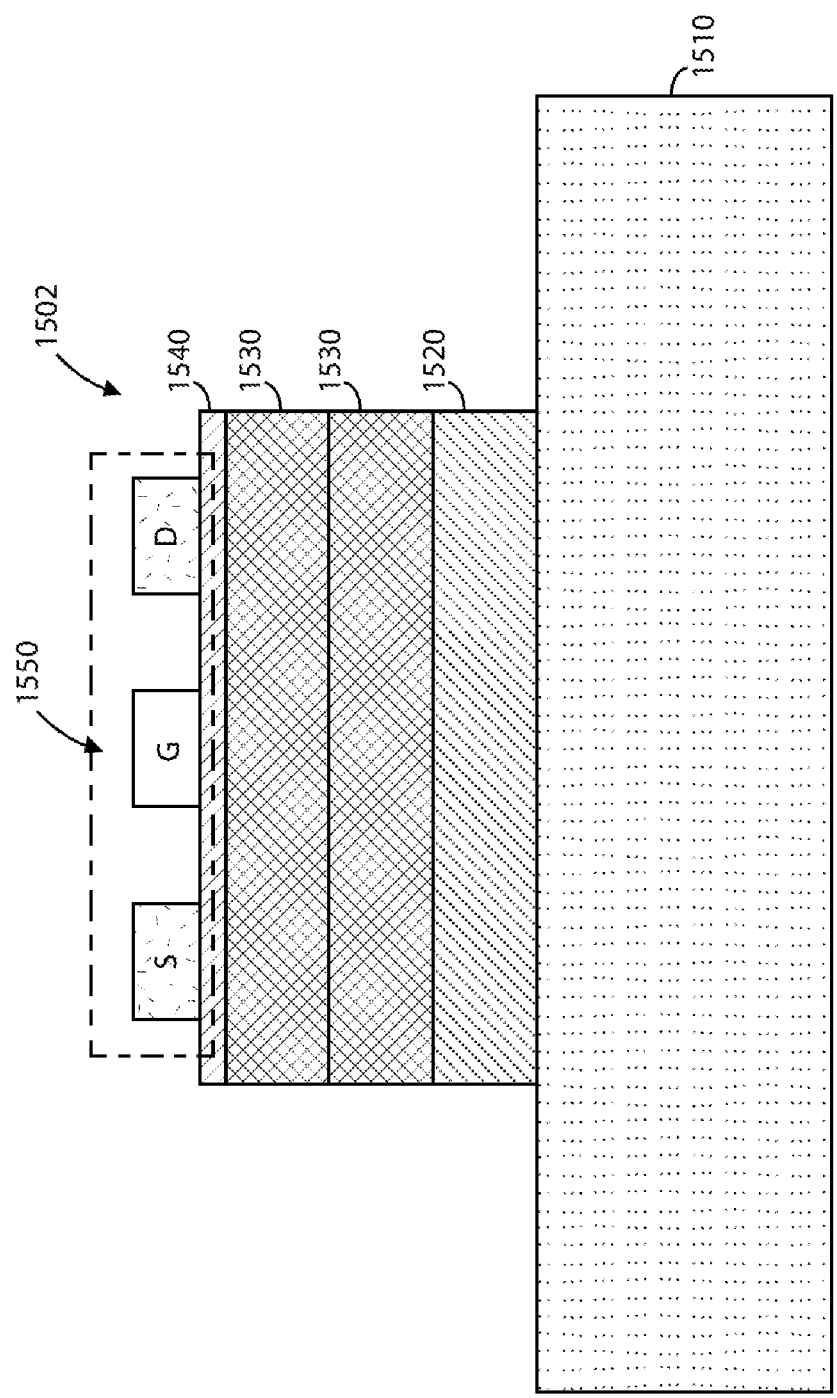

FIG. 15B shows a cross-sectional view of an example of a single crystal device with an active device having non-recessed contacts. As shown in device 1502, an active device 1550 is formed overlying the cap layer 1540. If there was no cap layer, then the active device would be formed overlying the top layer of the one or more second single crystal epitaxial layers 1530. This active device can be a PA, an LNA, or a switch, or any other active device component.

Figure 15C:
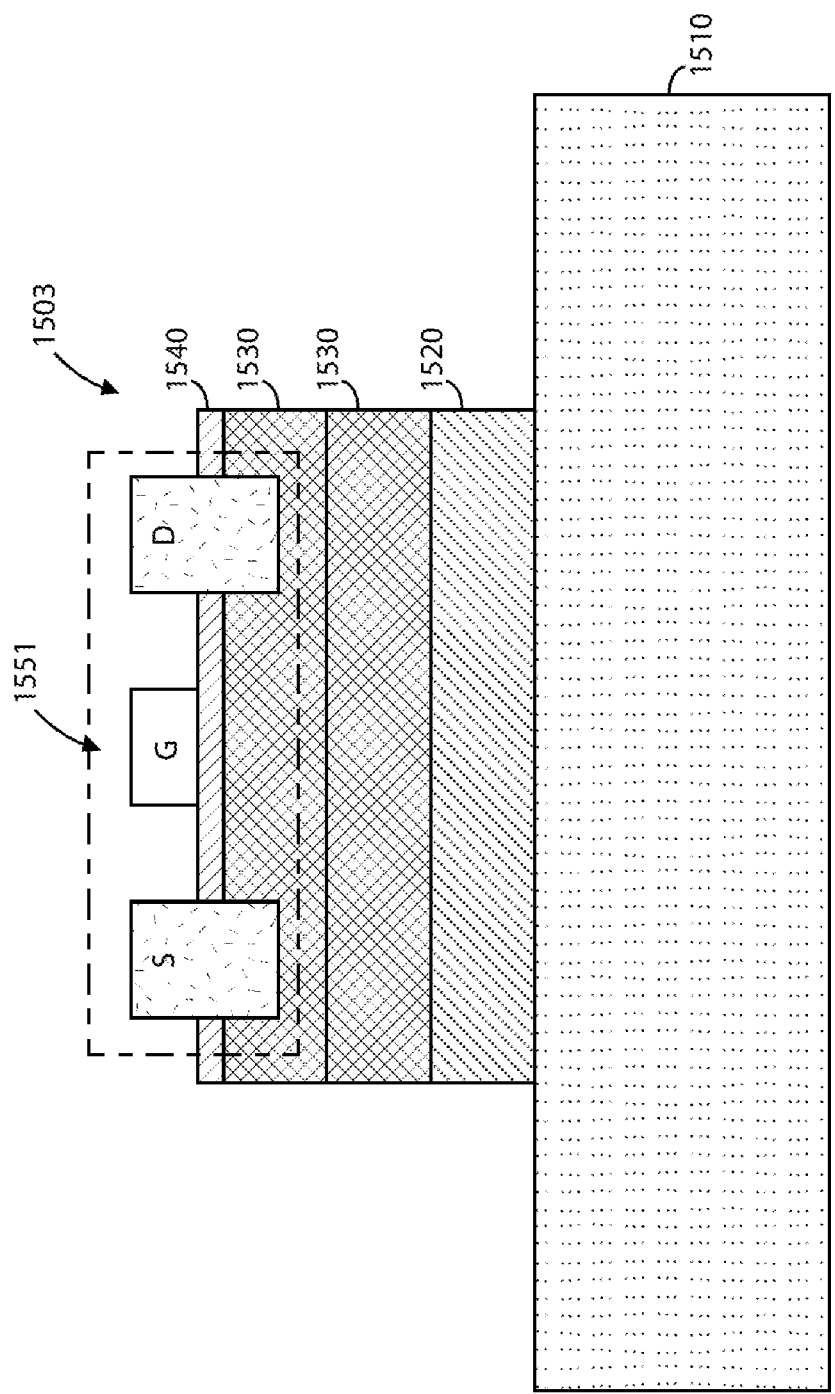

FIG. 15C shows a cross-sectional view of an example of a single crystal device with an active device having recessed contacts. As shown in device 1503, an active device 1551 is formed overlying the cap layer 1540. Here, the contacts of elements "S" and "D" extend past the cap layer and into the one or more second single crystal epitaxial layers 1530. As stated previously, this active device can be a PA, an LNA, or a switch, or any other active device component.

Figure 15D:
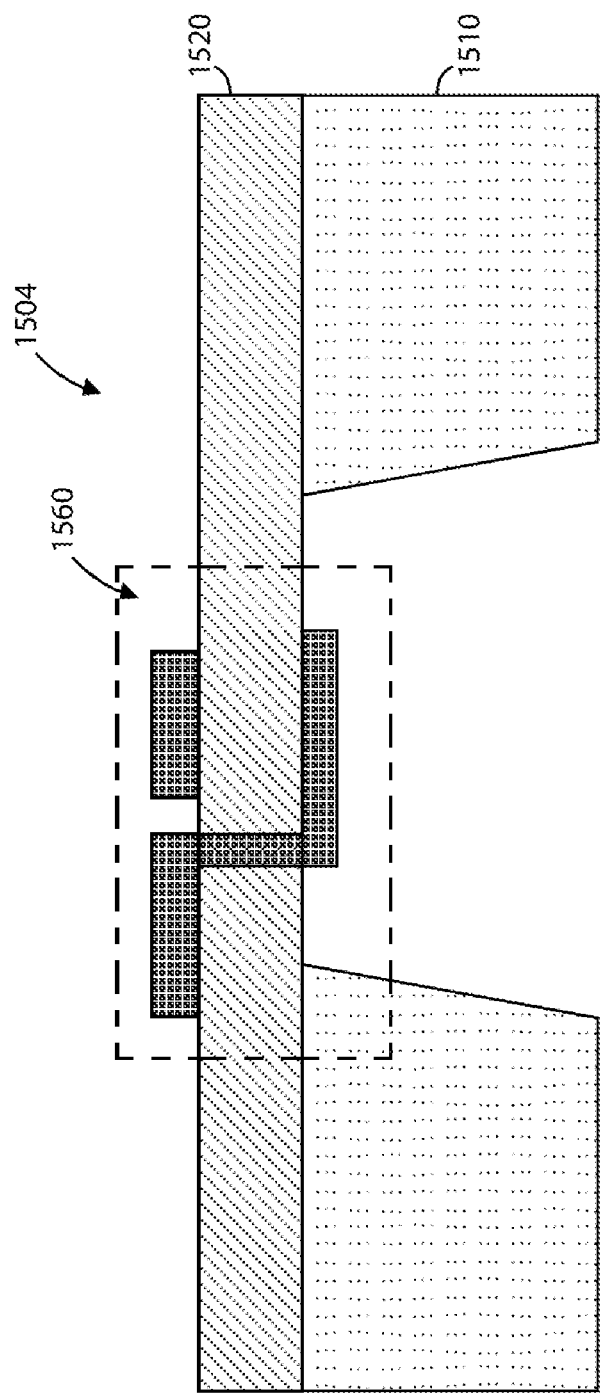

FIG. 15D shows a cross-sectional view of an example of a single crystal device with a passive filter device. As shown in device 1504, a filter device 1560 is formed through the first single crystal epitaxial layer 1520 with an underlying cavity in the substrate 1510. Other passive elements may also be implemented here.

Figure 15E:
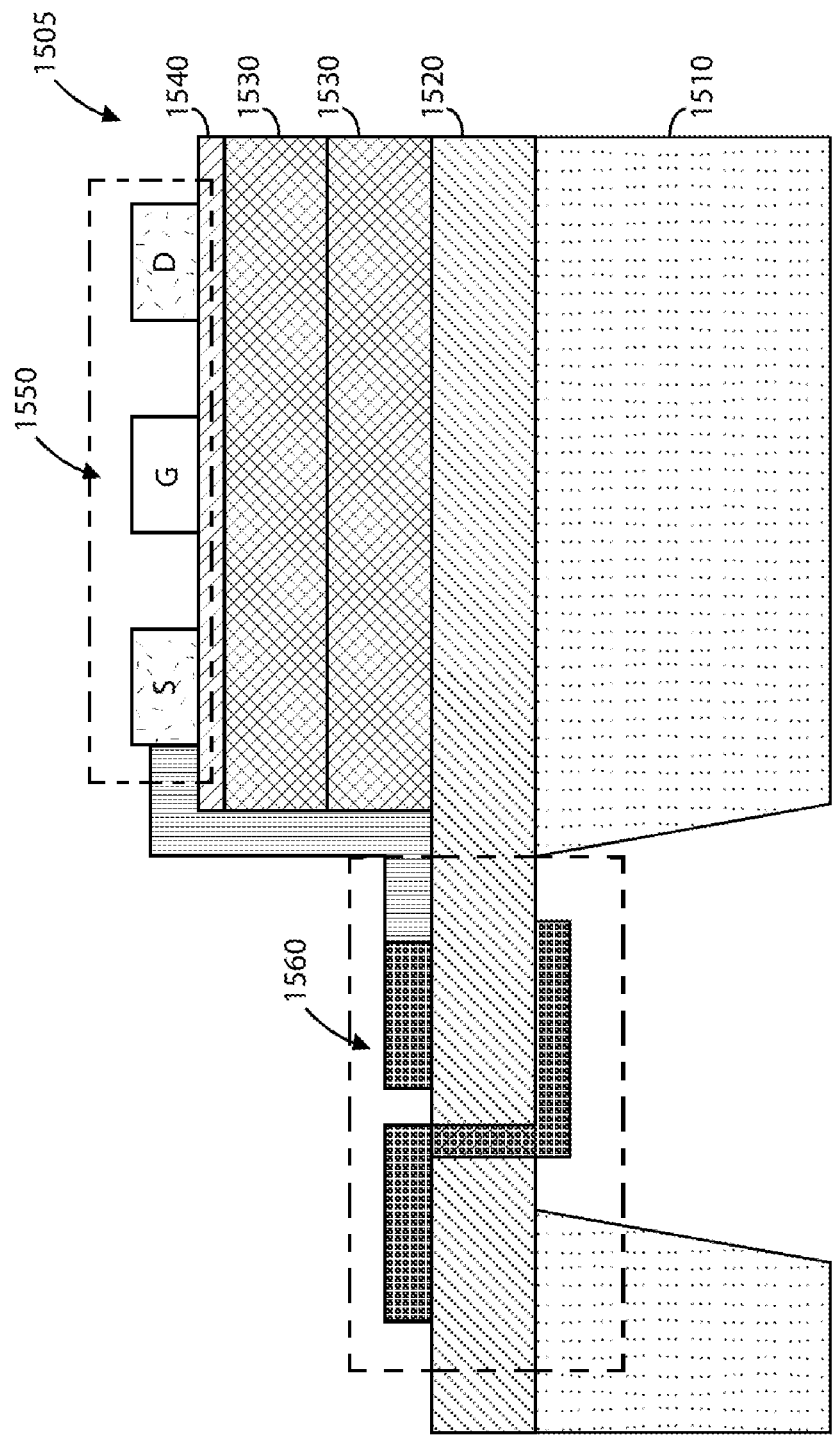

FIG. 15E shows a cross-sectional view of an example of a monolithic single chip single crystal device having a passive filter device and an active device having non-recessed contacts. As shown, device 1505 monolithically integrates the devices of FIGS. 15B and 15D, with the active device element 1550 and the filter device 1560. Of course, there can be other variations, modifications, and alternatives.

In an example, the monolithically integrated components described in FIGS. 13A-E and FIG. 14 can be implemented in an epitaxial stack structure as shown in FIGS. 15A-E. Compared to conventional embodiments, which combine various discretely packaged components onto a larger packaged device, the present invention provides a method to grow multiple single crystal device layers to monolithically integrate unpackaged active and passive single crystal components into a single chip package. This method is possible due to the use of single crystal bulk fabrication processes, such as those described previously. Using such a method, the resulting device can benefit from size reduction, improved performance, lower integrated cost, and a faster time to market.

One or more benefits are achieved over pre-existing techniques using the invention. In particular, the present device can be manufactured with lower integrated cost by using a smaller PCB area and fewer passive components. The monolithic single chip design of the present invention reduces the complexity of the front end module by eliminating wire bonds and discrete component packaging. Device performance can also be improved due to optimal impedance match, lower signal loss, and less assembly variability. Depending upon the embodiment, one or more of these benefits may be achieved. Of course, there can be other variations, modifications, and alternatives.

According to an example, the present invention provides a method of manufacturing a monolithic single chip single crystal device. The method can include providing a substrate having a substrate surface region; forming a first single crystal epitaxial layer overlying the substrate surface region; processing the first single crystal epitaxial layer to form one or more active or passive device components; forming one or more second single crystal epitaxial layers overlying the first single crystal epitaxial layer; and processing the one or more second single crystal epitaxial layers to form one or more active or passive device components. The first single crystal epitaxial layer and the one or more second single crystal epitaxial layers can form a monolithic epitaxial stack integrating multiple circuit functions.

The substrate can be selected from one of the following: a silicon substrate, a sapphire substrate, silicon carbide substrate, a GaN bulk substrate, a GaN template, an AlN bulk, an AlN template, and an $Al_xGa_{1-x}N$ template. In a specific example, the first single crystal epitaxial layer comprises an aluminum nitride (AlN) material used for the RF filter functionality, and wherein the first single crystal epitaxial layer is characterized by a thickness of about 0.01 um to about 10.0 um. In a specific example, at least one of the one or more second single crystal epitaxial layer comprises a single crystal aluminum gallium nitride ($Al_xGa_{1-x}N$) material, and wherein the second single crystal epitaxial layer is characterized by a composition of $0 \leq X < 1.0$ and a thickness of about 200 nm to about 1200 nm or a thickness of about 10 nm to about 40 nm. The one or more active or passive device components can include one or more filters, amplifiers, switches, or the like.

In an example, the method can further include forming a cap layer overlying the third epitaxial layer, wherein the cap layer comprises gallium nitride (GaN) materials. In a specific example, the cap layer is characterized by a thickness of about 0.10 nm to about 5.0 nm.

According to an example, the present invention also provides the resulting structure of the monolithic single chip single crystal device. The device includes a substrate having a substrate surface region; a first single crystal epitaxial layer formed overlying the substrate surface region, the first single crystal epitaxial layer having one or more active or passive device components; and one or more second single crystal epitaxial layers formed overlying the first single crystal epitaxial layer, the one or more second single crystal epitaxial layers having one or more active or passive device components. The first single crystal epitaxial layer and the one or more second single crystal epitaxial layers are formed as a monolithic epitaxial stack integrating multiple circuit functions.

Figure 16:
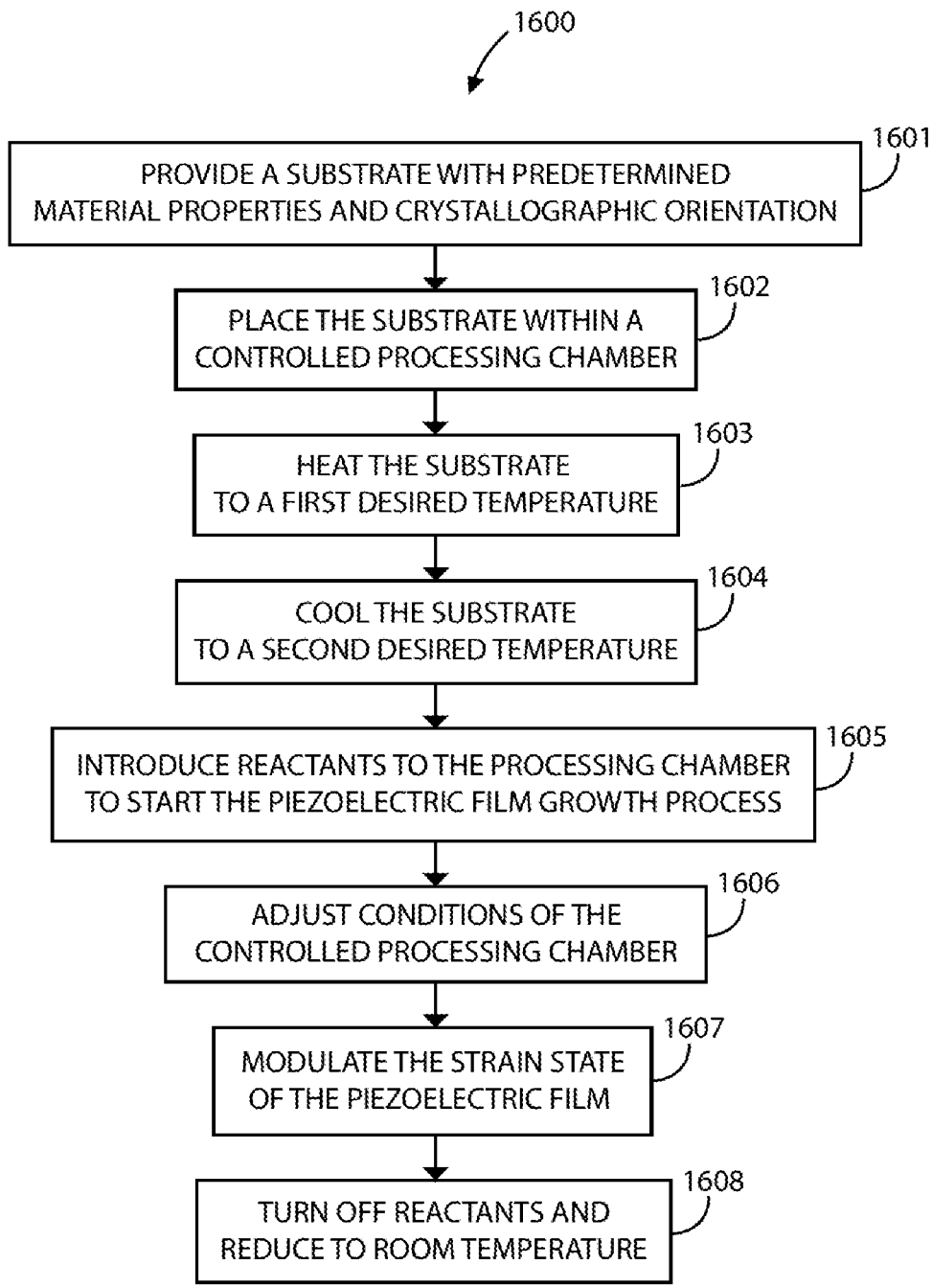
FIG. 16 is a simplified flow diagram illustrating a method for manufacturing an acoustic resonator device according to an example of the present invention.

FIG. 16 is a flow diagram illustrating a method for manufacturing an acoustic resonator device according to an example of the present invention. The following steps are merely examples and should not unduly limit the scope of the claims herein. One of ordinary skill in the art would recognize many other variations, modifications, and alternatives. For example, various steps outlined below may be added, removed, modified, rearranged, repeated, and/or overlapped, as contemplated within the scope of the invention. A typical growth process 1600 can be outlined as follows:

1601. Provide a substrate having the required material properties and crystallographic orientation. Various substrates can be used in the present method for fabricating an acoustic resonator device such as Silicon, Sapphire, Silicon Carbide, Gallium Nitride (GaN) or Aluminum Nitride (AlN) bulk substrates. The present method can also use GaN templates, AlN templates, and $Al_xGa_{1-x}N$ templates (where x varies between 0.0 and 1.0). These substrates and templates can have polar, non-polar, or semi-polar crystallographic orientations.

Those of ordinary skill in the art will recognize other variations, modifications, and alternatives;

1602. Place the selected substrate into a processing chamber within a controlled environment;

1603. Heat the substrate to a first desired temperature. At a reduced pressure between 5-800 mbar the substrates are heated to a temperature in the range of 1100°-1350° C. in the presence of purified hydrogen gas as a means to clean the exposed surface of the substrate. The purified hydrogen flow shall be in the range of 5-30 slpm (standard liter per minute) and the purity of the gas should exceed 99.9995%;

1604. Cool the substrate to a second desired temperature. After 10-15 minutes at elevated temperature, the substrate surface temperature should be reduced by 100-200° C.; the temperature offset here is determined by the selection of substrate material and the initial layer to be grown (Highlighted in FIGS. 18A-C);

1605. Introduce reactants to the processing chamber. After the temperature has stabilized the Group III and Group V reactants are introduced to the processing chamber and growth is initiated.

1606. Upon completion of the nucleation layer the growth chamber pressures, temperatures, and gas phase mixtures may be further adjusted to grow the layer or plurality of layers of interest for the acoustic resonator device.

1607. During the film growth process the strain-state of the material may be modulated via the modification of growth conditions or by the controlled introduction of impurities into the film (as opposed to the modification of the electrical properties of the film).

1608. At the conclusion of the growth process the Group III reactants are turned off and the temperature resulting film or films are controllably lowered to room. The rate of thermal change is dependent upon the layer or plurality of layers grown and in the preferred embodiment is balanced such that the physical parameters of the substrate including films are suitable for subsequent processing.

Referring to step 1605, the growth of the single crystal material can be initiated on a substrate through one of several growth methods: direct growth upon a nucleation layer, growth upon a super lattice nucleation layer, and growth upon a graded transition nucleation layer. The growth of the single crystal material can be homoepitaxial, heteroepitaxial, or the like. In the homoepitaxial method, there is a minimal lattice mismatch between the substrate and the films such as the case for a native III-N single crystal substrate material. In the heteroepitaxial method, there is a variable lattice mismatch between substrate and film based on in-plane lattice parameters. As further described below, the combinations of layers in the nucleation layer can be used to engineer strain in the subsequently formed structure.

Referring to step 1606, various substrates can be used in the present method for fabricating an acoustic resonator device. Silicon substrates of various crystallographic orientations may be used. Additionally, the present method can use sapphire substrates, silicon carbide substrates, gallium nitride (GaN) bulk substrates, or aluminum nitride (AlN) bulk substrates. The present method can also use GaN templates, AlN templates, and $Al_xGa_{1-x}N$ templates (where x varies between 0.0 and 1.0). These substrates and templates can have polar, non-polar, or semi-polar crystallographic orientations. Those of ordinary skill in the art will recognize other variations, modifications, and alternatives.

In an example, the present method involves controlling material characteristics of the nucleation and piezoelectric layer(s). In a specific example, these layers can include single crystal materials that are configured with defect densities of less than 1E+11 defects per square centimeter. The single crystal materials can include alloys selected from at least one of the following: AlN, AlGaN, GaN, InN, InGaN, AlInN, AlInGaN, and BN. In various examples, any single or combination of the aforementioned materials can be used for the nucleation layer(s) and/or the piezoelectric layer(s) of the device structure.

According to an example, the present method involves strain engineering via growth parameter modification. More specifically, the method involves changing the piezoelectric properties of the epitaxial films in the piezoelectric layer via modification of the film growth conditions (these modifications can be measured and compared via the sound velocity of the piezoelectric films). These growth conditions can include nucleation conditions and piezoelectric layer conditions. The nucleation conditions can include temperature, thickness, growth rate, gas phase ratio (V/III), and the like. The piezo electric layer conditions can include transition conditions from the nucleation layer, growth temperature, layer thickness, growth rate, gas phase ratio (V/III), post growth annealing, and the like. Further details of the present method can be found below.

Figure 17:
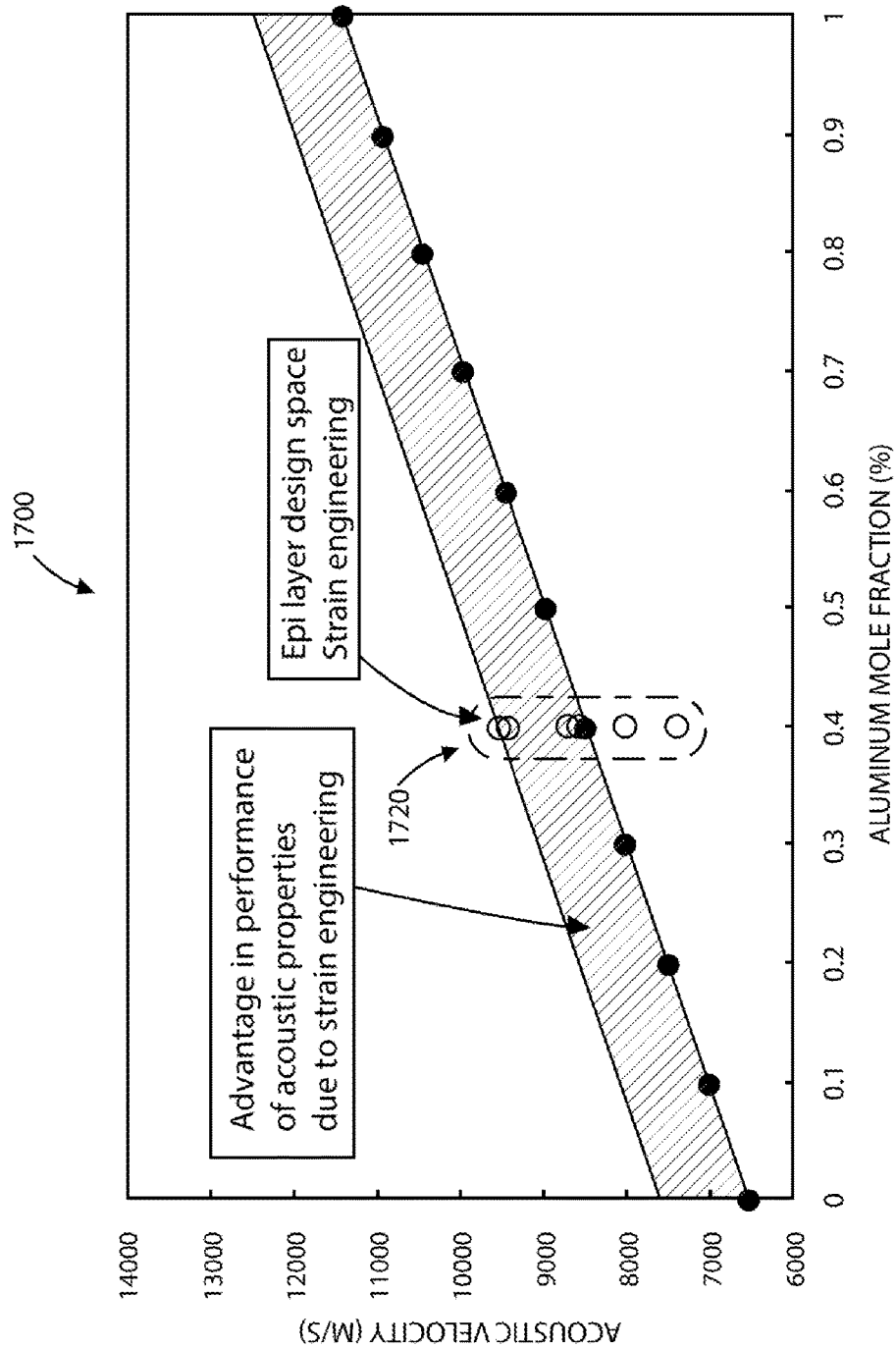
FIG. 17 is a simplified graph illustrating the results of forming a piezoelectric layer for an acoustic resonator device according to an example of the present invention. The graph highlights the ability of to tailor the acoustic properties of the material for a given Aluminum mole fraction. Such flexibility allows for the resulting resonator properties to be tailored to the individual application.

FIG. 17 is a simplified graph illustrating the results of forming a piezoelectric layer for an acoustic resonator device according to an example of the present invention. This graph highlights the ability of to tailor the acoustic properties of the material for a given Aluminum mole fraction. Referring to step 1607 above, such flexibility allows for the resulting resonator properties to be tailored to the individual application. As shown, graph 1700 depicts a plot of acoustic velocity (m/s) over aluminum mole fraction (%). The marked region 1720 shows the modulation of acoustic velocity via strain engineering of the piezo electric layer at an aluminum mole fraction of 0.4. Here, the data shows that the change in acoustic velocity ranges from about 7,500 m/s to about 9,500 m/s, which is about ±1,000 m/s around the initial acoustic velocity of 8,500 m/s. Thus, the modification of the growth parameters provides a large tunable range for acoustic velocity of the acoustic resonator device. This tunable range will be present for all aluminum mole fractions from 0 to 1.0 and is a degree of freedom not present in other conventional embodiments of this technology.

The present method also includes strain engineering by impurity introduction, or doping, to impact the rate at which a sound wave will propagate through the material. Referring to step 1607 above, impurities can be specifically introduced to enhance the rate at which a sound wave will propagate through the material. In an example, the impurity species can include, but is not limited to, the following: silicon (Si), magnesium (Mg), carbon (C), oxygen (O), erbium (Er), rubidium (Rb), strontium (Sr), scandium (Sc), beryllium (Be), molybdenum (Mo), zirconium (Zr), Hafnium (Hf), and vanadium (Va). Silicon, magnesium, carbon, and oxygen are common impurities used in the growth process, the concentrations of which can be varied for different piezoelectric properties. In a specific example, the impurity concentration ranges from about 1E+10 to about 1E+21 per cubic centimeter. The impurity source used to deliver the impurities to can be a source gas, which can be delivered directly, after being derived from an organometallic source, or through other like processes.

The present method also includes strain engineering by the introduction of alloying elements, to impact the rate at which a sound wave will propagate through the material. Referring to step 1607 above, alloying elements can be specifically introduced to enhance the rate at which a sound wave will propagate through the material. In an example, the alloying elements can include, but are not limited to, the following: magnesium (Mg), erbium (Er), rubidium (Rb), strontium (Sr), scandium (Sc), titanium (Ti), zirconium (Zr), Hafnium (Hf), vanadium (Va), Niobium (Nb), and tantalum (Ta). In a specific embodiment, the alloying element (ternary alloys) or elements (in the case of quaternary alloys) concentration ranges from about 0.01% to about 50%. Similar to the above, the alloy source used to deliver the alloying elements can be a source gas, which can be delivered directly, after being derived from an organometallic source, or through other like processes. Those of ordinary skill in the art will recognize other variations, modifications, and alternatives to these processes.

The methods for introducing impurities can be during film growth (in-situ) or post growth (ex-situ). During film growth, the methods for impurity introduction can include bulk doping, delta doping, co-doping, and the like. For bulk doping, a flow process can be used to create a uniform dopant incorporation. For delta doping, flow processes can be intentionally manipulated for localized areas of higher dopant incorporation. For co-doping, the any doping methods can be used to simultaneously introduce more than one dopant species during the film growth process. Following film growth, the methods for impurity introduction can include ion implantation, chemical treatment, surface modification, diffusion, co-doping, or the like. The of ordinary skill in the art will recognize other variations, modifications, and alternatives.

Figure 18A:
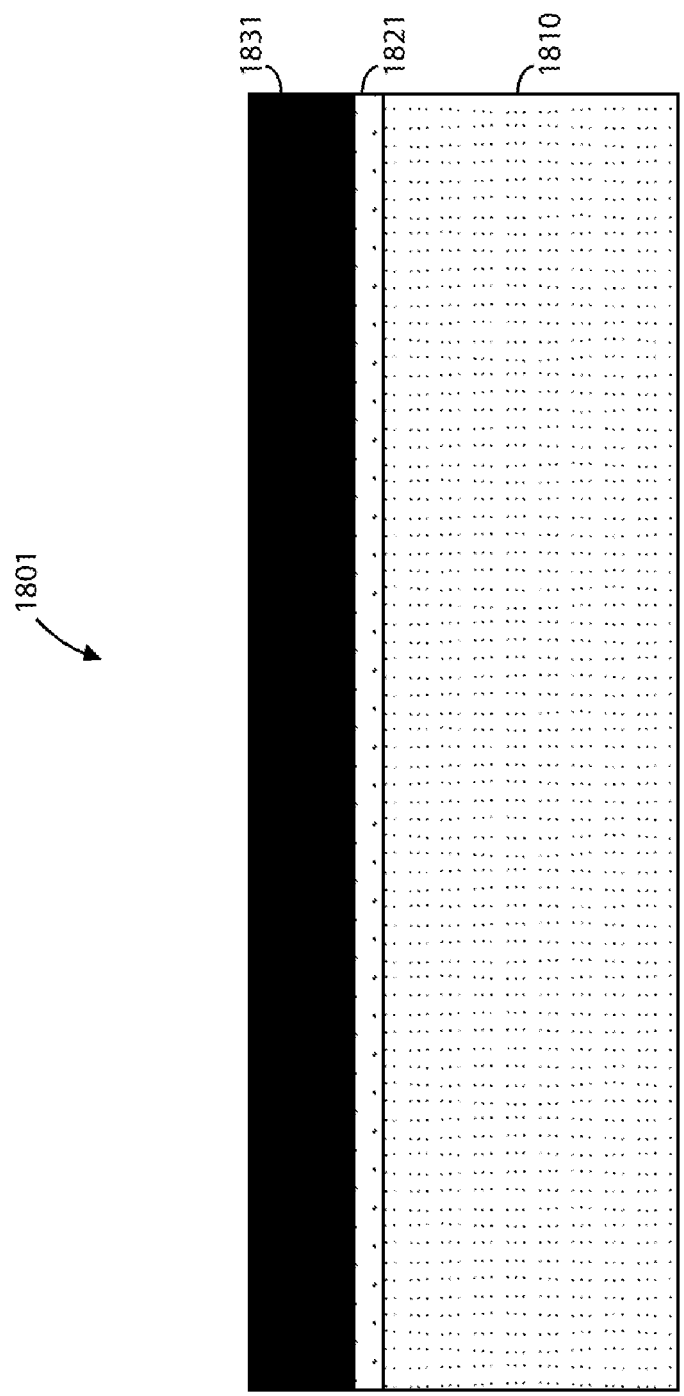
FIG. 18A is a simplified diagram illustrating a method for forming a piezoelectric layer for an acoustic resonator device according to an example of the present invention.

FIG. 18A is a simplified diagram illustrating a method for forming a piezoelectric layer for an acoustic resonator device according to an example of the present invention. As shown in device 1801, the piezoelectric layer 1831, or film, is directly grown on the nucleation layer 1821, which is formed overlying a surface region of a substrate 1810. The nucleation layer 1821 may be the same or different atomic composition as the piezoelectric layer 1831. Here, the piezoelectric film 1831 may be doped by one or more species during the growth (in-situ) or post-growth (ex-situ) as described previously.

Figure 18B:
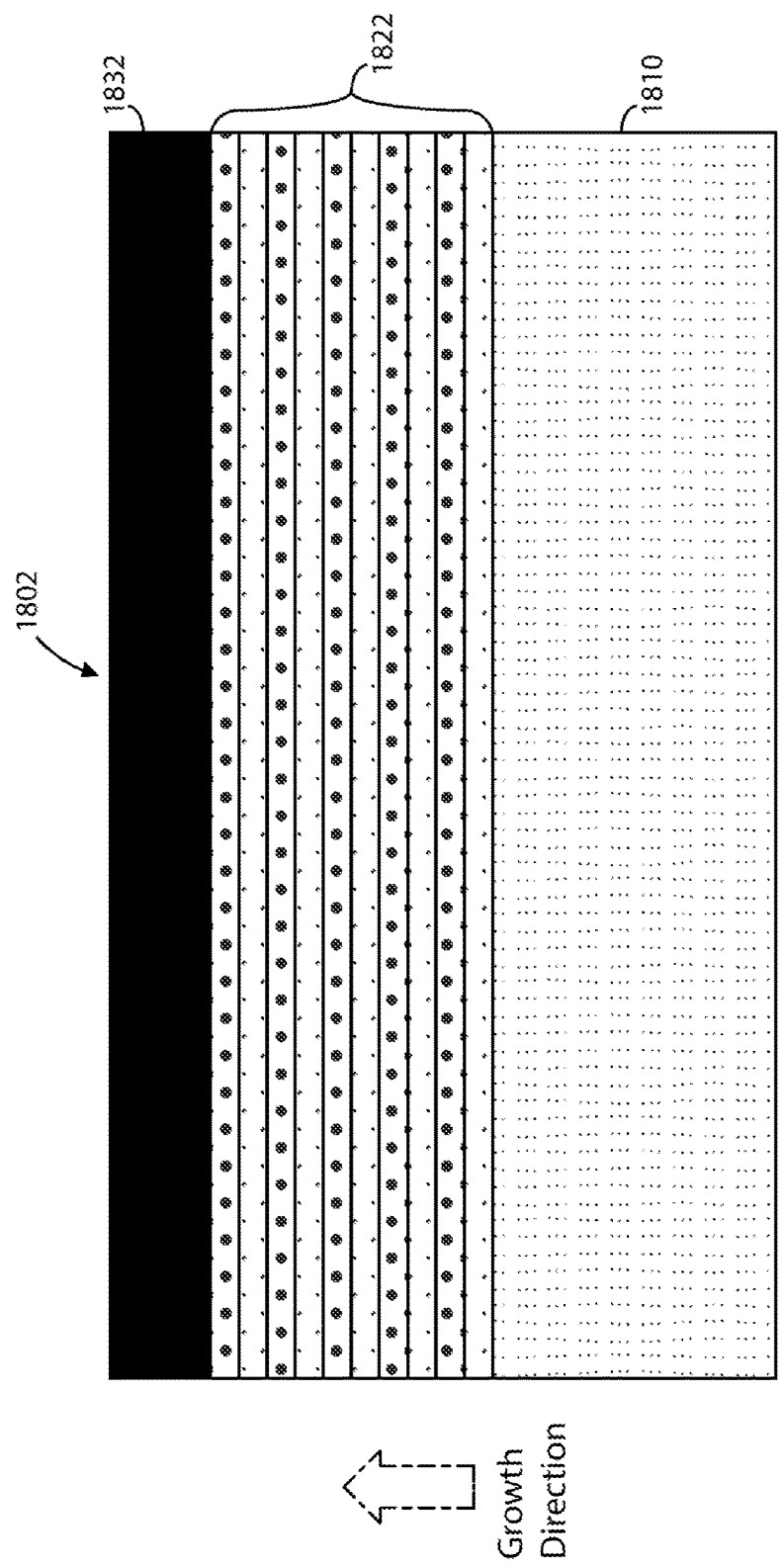
FIG. 18B is a simplified diagram illustrating a method for forming a piezoelectric layer for an acoustic resonator device according to an example of the present invention.

FIG. 18B is a simplified diagram illustrating a method for forming a piezoelectric layer for an acoustic resonator device according to an example of the present invention. As shown in device 1802, the piezoelectric layer 1832, or film, is grown on a super lattice nucleation layer 1822, which is comprised of layer with alternating composition and thickness. This super lattice layer 1822 is formed overlying a surface region of the substrate 1810. The strain of device 1802 can be tailored by the number of periods, or alternating pairs, in the super lattice layer 1822 or by changing the atomic composition of the constituent layers. Similarly, the piezoelectric film 1832 may be doped by one or more species during the growth (in-situ) or post-growth (ex-situ) as described previously.

Figure 18C:
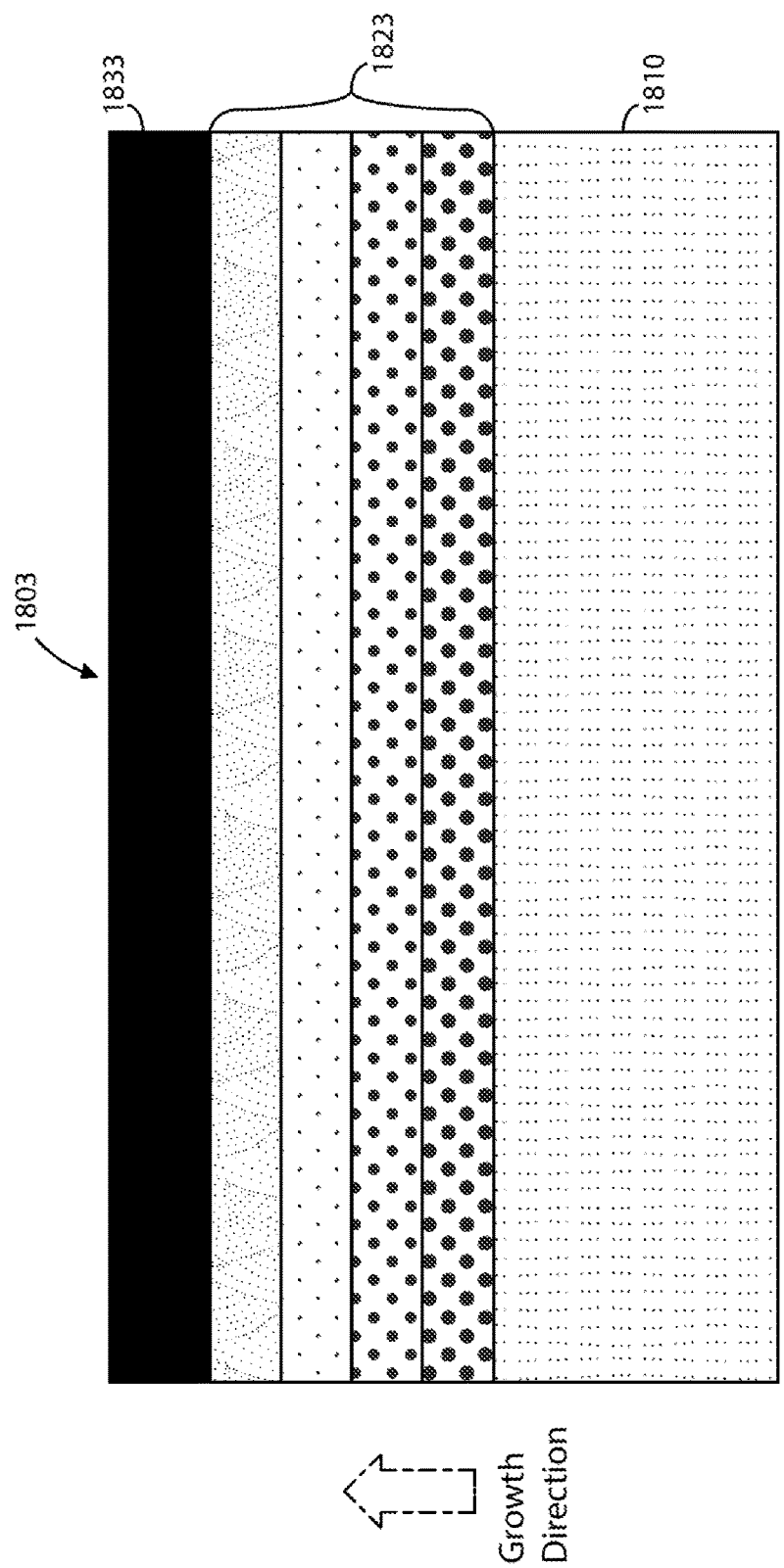
FIG. 18C is a simplified diagram illustrating a method for forming a piezoelectric layer for an acoustic resonator device according to an example of the present invention.

FIG. 18C is a simplified diagram illustrating a method for forming a piezoelectric layer for an acoustic resonator device according to an example of the present invention. As shown in device 1803, the piezoelectric layer 1833, or film, is grown on graded transition layers 1823. These transition layers 1823, which are formed overlying a surface region of the substrate 1810, can be used to tailor the strain of device 1803. In an example, the alloy (binary or ternary) content can be decreased as a function of growth in the growth direction. This function may be linear, step-wise, or continuous. Similarly, the piezoelectric film 1833 may be doped by one or more species during the growth (in-situ) or post-growth (ex-situ) as described previously.

In an example, the present invention provides a method for manufacturing an acoustic resonator device. As described previously, the method can include a piezoelectric film growth process such as a direct growth upon a nucleation layer, growth upon a super lattice nucleation layer, or a growth upon graded transition nucleation layers. Each process can use nucleation layers that include, but are not limited to, materials or alloys having at least one of the following: AlN, AlGaN, GaN, InN, InGaN, AlInN, AlInGaN, and BN. Those of ordinary skill in the art will recognize other variations, modifications, and alternatives.

One or more benefits are achieved over pre-existing techniques using the invention. In particular, the present device can be manufactured in a relatively simple and cost effective manner while using conventional materials and/or methods according to one of ordinary skill in the art. Using the present method, one can create a reliable single crystal based acoustic resonator using multiple ways of three-dimensional stacking through a wafer level process. Such filters or resonators can be implemented in an RF filter device, an RF filter system, or the like. Depending upon the embodiment, one or more of these benefits may be achieved. Of course, there can be other variations, modifications, and alternatives.

While the above is a full description of the specific embodiments, various modifications, alternative constructions and equivalents may be used. As an example, the packaged device can include any combination of elements described above, as well as outside of the present specification. As used herein, the term "substrate" can mean the bulk substrate or can include overlying growth structures such as an aluminum, gallium, or ternary compound of aluminum and gallium and nitrogen containing epitaxial region, or functional regions, combinations, and the like. Therefore, the above description and illustrations should not be taken as limiting the scope of the present invention which is defined by the appended claims.

What is claimed is:

1. A monolithic single chip single crystal device, the device comprising:
   a substrate having a substrate surface region and an underlying cavity region;
   a first single crystal epitaxial layer formed overlying the substrate surface region;
   a passive device configured within the first single crystal epitaxial layer and within the underlying cavity region;
   one or more second single crystal epitaxial layers formed overlying the first single crystal epitaxial layer;
   an active device configured overlying the one or more second single crystal epitaxial layers; and
   wherein the first single crystal epitaxial layer and the one or more second single crystal epitaxial layers are formed as a monolithic epitaxial stack integrating multiple circuit functions.

2. The device of claim 1 wherein the substrate is selected from one of the following: a silicon substrate, a sapphire substrate, silicon carbide substrate, a GaN bulk substrate, a GaN template, an AlN bulk, an AlN template, and an $Al_xGa_{1-x}N$ template.

3. The device of claim 1 wherein the first single crystal epitaxial layer comprises an aluminum nitride (AlN) material, and wherein the first single crystal epitaxial layer is characterized by a thickness of about 0.01 um to about 10.0 um.

4. The device of claim 1 wherein at least one of the one or more second single crystal epitaxial layers comprises a single crystal aluminum gallium nitride ($Al_xGa_{1-x}N$) material, and wherein the second single crystal epitaxial layer is characterized by a composition of $0 \leq X < 1.0$ and a thickness of about 200 nm to about 1200 nm.

5. The device of claim 1 wherein at least one of the one or more second single crystal epitaxial layers comprises single crystal aluminum gallium nitride ($Al_xGa_{1-x}N$) materials, and wherein the second single crystal epitaxial layer is characterized by a composition of $0.10 \leq X < 1.0$ and a thickness of about 10 nm to about 40 nm.

6. The device of claim 1 wherein the one or more active or passive components comprises one or more switches, filters, or amplifiers.

7. The device of claim 1 further comprising a cap layer overlying the one or more second epitaxial layers, wherein the cap layer comprises gallium nitride (GaN) materials.

8. The device of claim 7 wherein the cap layer is characterized by a thickness of about 0.10 nm to about 5.0 nm.

9. The device of claim 7 wherein the active device is configured overlying the cap layer.

* * * * *